(12) United States Patent
Yang et al.

(10) Patent No.: US 10,795,503 B2
(45) Date of Patent: Oct. 6, 2020

(54) DEVICE AND METHOD FOR CAPACITIVE SENSING

(71) Applicant: SYNAPTICS INCORPORATED, San Jose, CA (US)

(72) Inventors: Xueyong Yang, Tokyo (JP); Tetsuo Tanemura, Tokyo (JP); Nobukazu Tanaka, Tokyo (JP); Takayuki Noto, Tokyo (JP)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 16/533,490

(22) Filed: Aug. 6, 2019

(65) Prior Publication Data
US 2020/0050320 A1   Feb. 13, 2020

(30) Foreign Application Priority Data

Aug. 9, 2018   (JP) .................................. 2018-150310

(51) Int. Cl.
*G06F 3/041*   (2006.01)
*G06F 3/044*   (2006.01)
*H01L 27/32*   (2006.01)

(52) U.S. Cl.
CPC .......... *G06F 3/0418* (2013.01); *G06F 3/0412* (2013.01); *G06F 3/0446* (2019.05); *H01L 27/323* (2013.01)

(58) Field of Classification Search
CPC .... G06F 3/0418; G06F 3/0446; G06F 3/0412; H01L 27/323
See application file for complete search history.

(56) References Cited

U.S. PATENT DOCUMENTS 9,952,732 B2 *   4/2018   Wu .......................... G06F 3/044
2017/0322245 A1 *  11/2017  Wen ....................... G06F 3/0412

* cited by examiner

*Primary Examiner* — Lisa S Landis
(74) *Attorney, Agent, or Firm* — Patterson + Sheridan, LLP

(57) ABSTRACT

A semiconductor device comprises driver circuitry, an analog-digital (AD) converter, and processing circuitry. The driver circuitry is configured to supply a drive signal to a sensor array in a sensing frame comprising 2N bursts, N being an integer of two or more. The mixer circuitry is configured to modulate a plurality of carrier waves with a plurality of sensing signals corresponding to capacitances of a plurality of sensing electrodes of the sensor array, respectively, to output a plurality of mixer outputs. A number of the plurality of sensing electrodes is 2N−1 or 2N. The AD converter is configured to perform AD conversion on a sum signal of the plurality of mixer outputs. The processing circuitry is configured to detect an object based on the output of the AD converter.

20 Claims, 9 Drawing Sheets

DEVICE AND METHOD FOR CAPACITIVE SENSING

CROSS REFERENCE

This application claims priority to Japanese Patent Application No. 2018-150310, filed on Aug. 9, 2018, the disclosure of which is incorporated herein by reference in its entirety.

BACKGROUND

Field

The present disclosure relates to a device and method for capacitive sensing.

Description of the Related Art

Capacitive sensing is used for proximity sensing to detect an approach or contact of an object, e.g., a user's finger or a stylus, to an input device, e.g., a touch panel. While performing capacitive sensing, motion artifacts may be detected. As the motion artifacts may generate errors while performing capacitive sensing, a capacitive sensing system may be designed to suppress detection of a motion artifact.

SUMMARY

In one or more embodiments, a semiconductor device comprises driver circuitry, mixer circuitry, an analog-digital (AD) converter, and a processing circuitry. The driver circuitry is configured to supply a drive signal to a sensor array in a sensing frame comprising 2N bursts, N being an integer of two or more. The mixer circuitry is configured to modulate a plurality of carrier waves with a plurality of sensing signals corresponding to capacitances of a plurality of sensing electrodes of the sensor array, respectively, to output a plurality of mixer outputs. The number of the plurality of sensing electrodes being 2N−1 or 2N. The AD converter is configured to perform AD conversion on a sum signal of the plurality of mixer outputs. The processing circuitry is configured to perform proximity sensing of an object to the sensor array with respect to the sensing frame based on the output of the AD converter. A carrier wave modulated with one of the plurality of sensing signals is selected from first and second carrier waves during a plurality of first bursts of the 2N bursts. The first carrier wave being in phase with the drive signal, and the second carrier wave has a phase shifted from that of the first carrier wave by $\pi$.

In one or more embodiments, a method comprises supplying a drive signal to a sensor array in a sensing frame comprising 2N bursts. N being an integer of two or more. The method further comprises modulating a plurality of carrier waves with a plurality of sensing signals corresponding to capacitances of a plurality of sensing electrodes of the sensor array, respectively, to output a plurality of mixer outputs. The number of the plurality of sensing electrodes being 2N−1 or 2N. Further, the method comprises performing AD conversion on a sum signal of the plurality of mixer outputs to generate a digital data stream. Additionally, the method comprises performing proximity sensing of an object to the sensor array with respect to the sensing frame based on the digital data stream. A carrier wave modulated with one of the plurality of sensing signals is selected from first and second carrier waves during a plurality of first bursts of the 2N bursts. The first carrier wave being in phase with the drive signal, and the second carrier wave has a phase shifted from that of the first carrier wave by $\pi$.

BRIEF DESCRIPTION OF THE DRAWINGS

So that the manner in which the above recited features of the present disclosure may be understood in detail, a more particular description of the disclosure, briefly summarized above, may be had by reference to embodiments, some of which are illustrated in the appended drawings. It is to be noted, however, that the appended drawings illustrate only some embodiments of this disclosure and are therefore not to be considered limiting of its scope, for the disclosure may admit to other equally effective embodiments.

DETAILED DESCRIPTION

Figure 1:
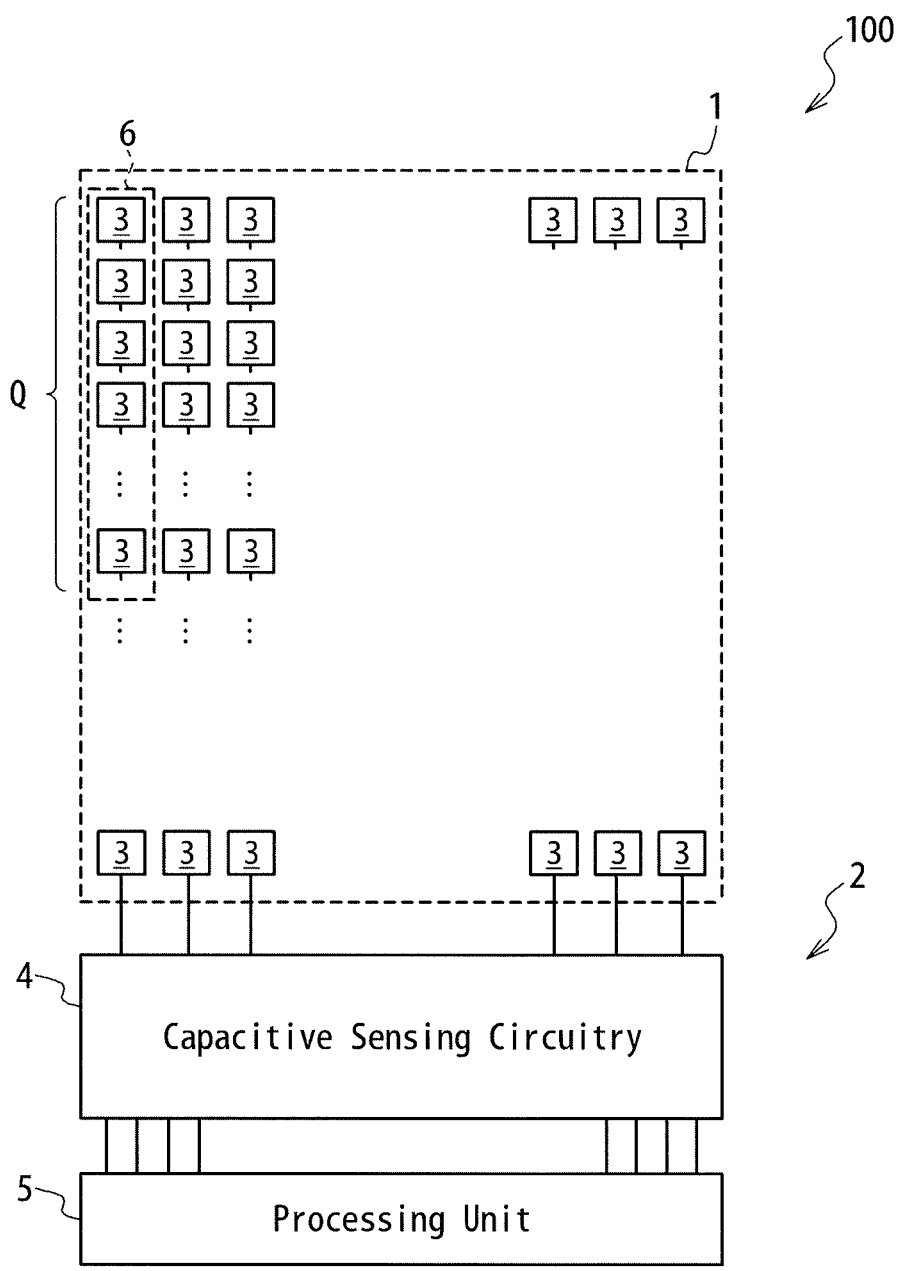
FIG. 1 is a block diagram illustrating an example configuration of a capacitive sensing system, according to one or more embodiments.

A description is given below of embodiments of this disclosure. In the following, same or similar components may be denoted by same or corresponding reference numerals. Suffixes may be attached to reference numerals to distinguish same components from each other.

In one or more embodiments, as illustrated in FIG. 1, a capacitive sensing system 100 comprises a sensor array 1 and a semiconductor device 2.

In one or more embodiments, the sensor array 1 comprises sensing electrodes 3 arrayed in rows and columns. In one or more embodiments, the sensor array 1 may be integrated in a touch panel. In alternative embodiments, the sensor array 1 may be integrated in a display panel, such as a liquid crystal display (LCD) panel and an organic light emitting diode (OLED) display panel. When the sensor array 1 is integrated in an LCD panel comprising a plurality of common electrodes arrayed in rows and column, the common electrodes may be used as the sensing electrodes 3, in one or more embodiments. In one or more embodiments, the sensing electrodes 3 are connected to the semiconductor device 2.

In one or more embodiments, the semiconductor device 2 comprises capacitive sensing circuitry 4 and a processing unit 5. In one or more embodiments, the capacitive sensing circuitry 4 is configured to obtain sensing signals having signal levels corresponding to capacitances of the sensing electrodes 3 and generate digital outputs based on the sensing signals. The processing unit 5 is configured to perform arithmetic processing on the digital outputs received from the capacitive sensing circuitry 4 to achieve proximity sensing of an object, such as a user's finger and a stylus, to the sensor array 1. In one or more embodiments, the arithmetic processing for the proximity sensing is performed in units of Q sensing electrodes arrayed in a specific direction, for example, the vertical direction in FIG. 1, where Q is an integer of three or more. When the sensor array 1 is integrated in a display panel, display driver circuitry configured to drive the display panel may be integrated in the semiconductor device 2.

Figure 2:
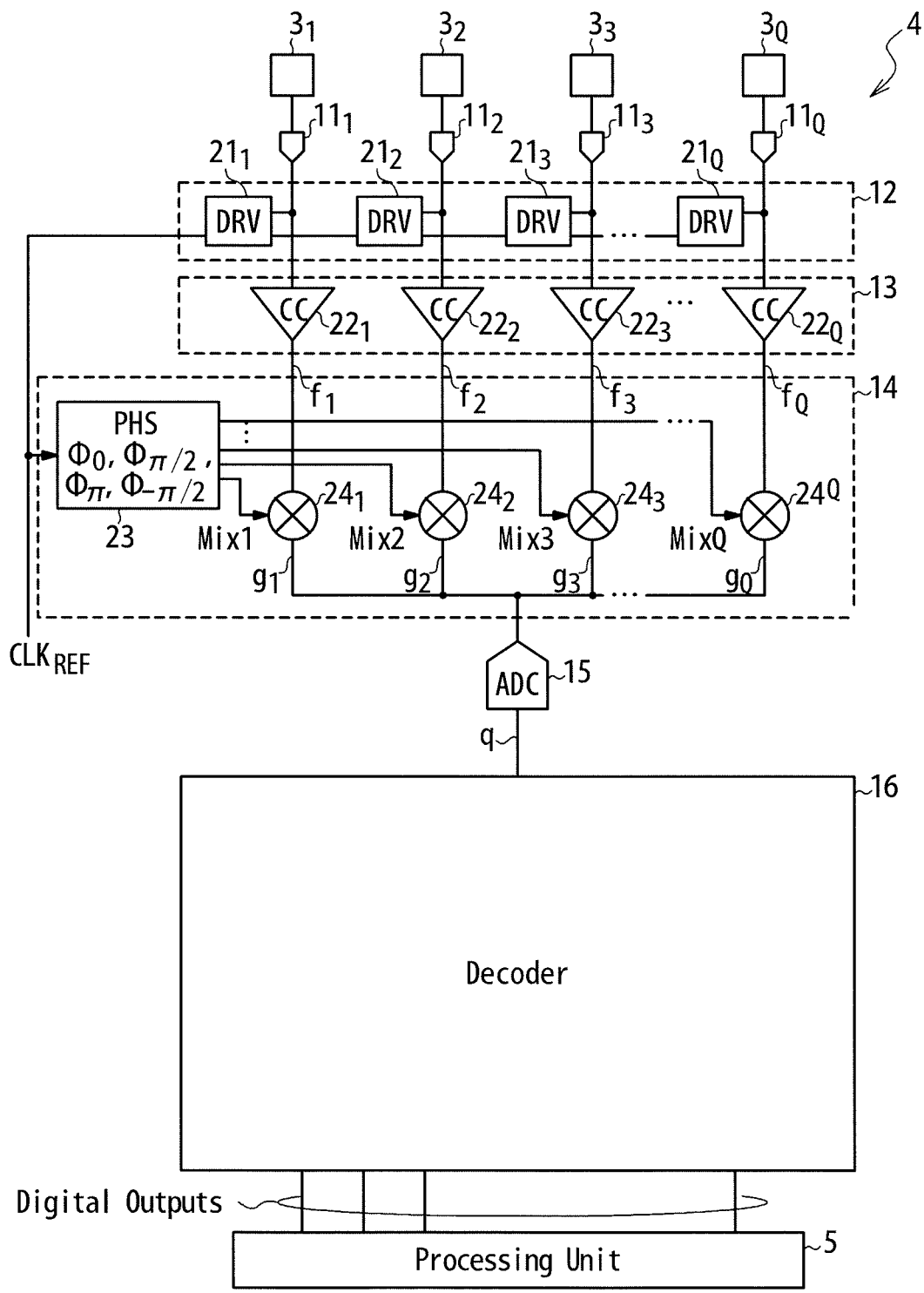
FIG. 2 is a circuit diagram illustrating an example configuration of capacitive sensing circuitry, according to one or more embodiments.

In one or more embodiments, as illustrated in FIG. 2, the capacitive sensing circuitry 4 comprises input terminals $11_1$ to $11_Q$ connected to the sensing electrodes $3_1$ to $3_Q$, respectively, driver circuitry 12, current conveyer circuitry 13, encoder circuitry 14, an analog-digital (AD) converter 15, and decoder circuitry 16. Illustrated in FIG. 2 is the configuration of a part of the capacitive sensing circuitry 4 related to the Q sensing electrodes 3 enclosed in the dotted box 6 in FIG. 1. In one or more embodiments, the Q sensing electrodes 3 illustrated in FIG. 2 are arrayed in the vertical direction in FIG. 1. In one or more embodiments, one AD converter 15 is prepared for Q sensing electrodes 3.

In one or more embodiments, the driver circuitry 12 comprises Q drivers $21_1$ to $21_Q$ connected to the input terminals $11_1$ to $11_Q$, respectively. In one or more embodiments, the drivers $21_1$ to $21_Q$ are configured to supply drive signals to the sensing electrodes $3_1$ to $3_Q$, respectively. In one or more embodiments, the drive signals are periodic signals of a frequency of $f_{REF}$. In one or more embodiments, the drivers $21_1$ to $21_Q$ are supplied with a reference clock signal $CLK_{REF}$ of the frequency $f_{REF}$, and configured to generate the drive signals in synchronization with the reference clock signal $CLK_{REF}$. Signals of various waveforms may be used as the drive signals. For example, signals of a sinusoidal, triangular, or rectangular waveform may be used as the drive signals.

In one or more embodiments, the current conveyer circuitry 13 comprises current conveyers $22_1$ to $22_Q$ connected to the input terminals $11_1$ to $11_Q$, respectively. In one or more embodiments, the current conveyers $22_1$ to $22_Q$ are configured to output sensing signals $f_1$ to $f_Q$ having signal levels corresponding to current levels of charging and discharging currents of the sensing electrodes $3_1$ to $3_Q$, respectively. In one or more embodiments, the charging and discharging currents of the sensing electrodes $3_1$ to $3_Q$ depend on the self-capacitances of the sensing electrodes $3_1$ to $3_Q$ when the drive signals are supplied to the sensing electrodes $3_1$ to $3_Q$, and the sensing signals $f_1$ to $f_Q$ are obtained as signals generated by modulating the periodic signals of the frequency $f_{REF}$ with information of the self-capacitances of the sensing electrodes $3_1$ to $3_Q$.

In one or more embodiments, the encoder circuitry 14 comprises a phase shifter 23 and Q mixers $24_1$ to $24_Q$. In one or more embodiments, the phase shifter 23 is configured to supply carrier waves Mix1 to MixQ to the mixers $24_1$ to $24_Q$, respectively, in synchronization with the reference clock signal $CLK_{REF}$. In one or more embodiments, the mixers $24_1$ to $24_Q$ are configured to generate mixer outputs $g_1$ to $g_Q$ by modulating the carrier waves Mix1 to MixQ with the sensing signals $f_1$ to $f_Q$, respectively.

In one or more embodiments, the carrier waves Mix1 to MixQ are each selected from signals $\Phi_{-\pi/2}$, $\Phi_0$, $\Phi_{\pi/2}$, and $\Phi_\pi$. In one or more embodiments, the signal $\Phi_0$ is a signal in phase with the drive signals. In one or more embodiments, the signal $\Phi_0$ is a periodic signal having the same phase as that of the current waveforms of the drive signals. In one or more embodiments, the signal $\Phi_\pi$ is a signal of the opposite phase to that of the drive signals. In one or more embodiments, the signal $\Phi_{\pi/2}$ is a periodic signal having a phase delayed from that of the signal $\Phi_0$ by $\pi/2$, and the signal $\Phi_{-\pi/2}$ is a periodic signal having a phase advanced from that of the signal $\Phi_0$ by $\pi/2$, that is, a phase delayed from that of the signal $\Phi_0$ by $3\pi/2$.

In one or more embodiments, a sum signal of the mixer outputs $g_1$ to $g_Q$ outputted from the mixers $24_1$ to $24_Q$ is supplied to the AD converter 15. In one or more embodiments, the mixer outputs $g_1$ to $g_Q$ are current signals, and the outputs of the mixer $24_1$ to $24_Q$ are commonly connected to the input of the AD converter 15 to achieve the addition of the mixer outputs $g_1$ to $g_Q$ through wired-sum. FIG. 2 illustrates such a configuration.

When the carrier wave Mixk, which is modulated with the sensing signal $f_k$, is selected from the signals $\Phi_0$ and $\Phi_\pi$, the mixer output $g_k$ outputted from the mixer $24_k$ comprises information of an effective signal component for proximity sensing, in one or more embodiments. When the carrier wave Mixk is selected from the signals $\Phi_{\pi/2}$ and $\Phi_{-\pi/2}$, the mixer output $g_k$ comprises information of a noise component, in one or more embodiments. The signal level of the mixer output $g_k$ is originally expected to be zero, when the carrier wave Mixk is selected from the signals $\Phi_{\pi/2}$ and $\Phi_{-\pi/2}$, in one or more embodiments. In one or more embodiments, when the signal level of the mixer output $g_k$ is not zero, this indicates that the sensing signal $f_k$ experiences an influence of noise. In one or more embodiments, the mixer output $g_k$ may be used for noise detection, when the carrier wave Mixk is selected from the signals $\Phi_{\pi/2}$ and $\Phi_{-\pi/2}$.

A periodic signal of a different phase from that of the signals $\Phi_0$ and $\Phi_\pi$ may be used in place of the signal $\Phi_{\pi/2}$ or $\Phi_{-\pi/2}$. In one or more embodiments, the signal level of the mixer output $g_k$ incorporates information of a noise component when a periodic signal of a different phase from that of the signals $\Phi_0$ and $\Phi_\pi$ is used as the carrier wave Mixk. Also in this case, the mixer output $g_k$ may be used for noise detection.

In one or more embodiments, the configuration of the encoder circuitry 14 achieves code division multiplexing. In one or more embodiments, codes are assigned to the sensing signals $f_1$ to $f_Q$. In one or more embodiments, the phase shifter 23 is configured to select the carrier wave Mixk from among the signals $\Phi_{-\pi/2}$, $\Phi_0$, $\Phi_{\pi/2}$ and $\Phi_\pi$ based on the code assigned to the sensing signal $f_k$ and supply the selected carrier wave Mixk to the mixer $24_k$.

In one or more embodiments, the AD converter 15 is configured to perform analog-digital conversion on the sum signal of the mixer outputs $g_1$ to $g_Q$ received from the mixers $24_1$ to $24_Q$ to output a digital data stream q.

In one or more embodiments, the decoder circuitry 16 constitutes processing circuitry configured to process the output of the AD converter 15, that is, the digital data stream q, together with the processing unit 5. In one or more embodiments, the decoder circuitry 16 is configured to decode the digital data stream q received from the AD converter 15 to generate the digital outputs. In one or more embodiments, the decoder circuitry 16 is configured to perform a product-sum operation to generate the digital outputs. In one or more embodiments, the processing unit 5 is configured to perform arithmetic processing on the digital outputs from the decoder circuitry 16 to achieve proximity sensing of an object to the sensor array 1. In one or more embodiments, this arithmetic processing may comprise processing for detecting the position at which the object approaches or is in contact with the sensor array 1.

In one or more embodiments, Q is an even number of four or more. In this case, Q can be represented as 2N, where N is an integer of two or more. It should be noted that the technologies of this disclosure are applicable to a case where Q is an odd number of three or more, as described later.

Figure 3:
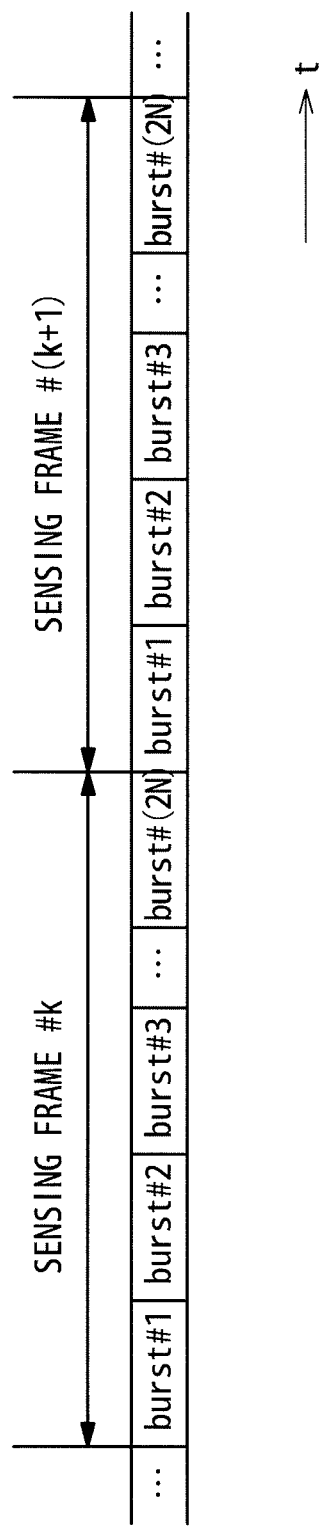
FIG. 3 illustrates an example operation of the capacitive sensing system, according to one or more embodiments.

In one or more embodiments, as illustrated in FIG. 3, proximity sensing is performed in each sensing frame. In one or more embodiments, each sensing frame comprises Q bursts, that is, 2N bursts. The 2N bursts may be referred to as bursts #1 to #(2N), respectively. In one or more embodiments, the drivers $21_1$ to $21_{2N}$ are configured to continue outputting drive signals over bursts #1 to #(2N) with a constant waveform.

In one or more embodiments, when a drive signal is supplied to the sensing electrode 3, with a constant waveform over bursts #1 to #(2N), the waveform of the sensing signal $f_i$ is expected to remain unchanged over bursts #1 to #(2N), and therefore the waveform of the mixer output $g_i$ outputted from the mixer $24_i$ is also expected to remain unchanged over bursts #1 to #(2N). It is therefore expected that the following expressions (1) hold:

$$A_1(t) = A_1(t+T) = \ldots = A_1(t+(2N-1)T), \quad (1)$$
$$A_2(t) = A_2(t+T) = \ldots = A_2(t+(2N-1)T),$$
$$\ldots$$
$$A_{2N}(t) = A_{2N}(t+T) = \ldots = A_{2N}(t+(2N-1)T),$$

where $t, t+T, \ldots$ and $t+(2N-1)T$ are the times when the AD converter 15 samples the input signal during burst #1 to #(2N), respectively, and $A_1(t)$ to $A_{2N}(t)$ are the signal levels of the sensing signals $f_1$ to $f_{2N}$ at time t.

For simplicity, the signal levels of the sensing signals $f_1$ to $f_{2N}$ at times $t, t+T \ldots$ and $t+(2N-1)$ may be simply referred to as $A_1$ to $A_{2N}$. The signal levels on the inputs of the encoder circuitry 14, that is, the signal levels of the sensing signals $f_1$ to $f_{2N}$ may be collectively represented by an input tensor a, which is represented by the following expression (2):

$$a = \begin{pmatrix} A_1 \\ A_2 \\ \vdots \\ A_{2N} \end{pmatrix}. \quad (2)$$

In one or more embodiments, the processing performed by the encoder circuitry 14 during bursts #1 to #(2N) can be expressed as an encode tensor E defined by the following expression (3):

$$E = \begin{pmatrix} e_{11} & \cdots & e_{1(2N)} \\ \vdots & \ddots & \vdots \\ e_{(2N)1} & \cdots & e_{(2N)(2N)} \end{pmatrix}, \quad (3)$$

where the $j^{th}$ row of the encode tensor E represents the processing performed during burst #j by the encoder circuitry 14, and the $k^{th}$ column represents the modulation using the sensing signal $f_k$. For a case where the mixer $24_1$ to $24_Q$ all have a gain of 1, for example, the element $e_{jk}$ of the encode tensor E is $e^{i0}$ (=1), $e^{i\pi/2}$ (=i), $e^{i\pi}$ (=−1), and $e^{-i\pi/2}$ (=−i) when the carrier wave Mixk, which is modulated with the sensing signal $f_k$, is the signal $\Phi_0$, $\Phi_{\pi/2}$, $\Phi_\pi$, and $\Phi_{-\pi/2}$, respectively, during burst #j.

In one or more embodiments, the digital data stream q outputted from the AD converter 15 can be represented by the following expression (4):

$$\begin{pmatrix} q_1 \\ q_2 \\ \vdots \\ q_{2N} \end{pmatrix} = Ea = \begin{pmatrix} e_{11} & \cdots & e_{1(2N)} \\ \vdots & \ddots & \vdots \\ e_{(2N)1} & \cdots & e_{(2N)(2N)} \end{pmatrix} \begin{pmatrix} A_1 \\ A_2 \\ \vdots \\ A_{2N} \end{pmatrix}, \quad (4)$$

where $q_1$ to $q_{2N}$ are the values of the digital data stream q during bursts #1 to #(2N), respectively.

In one or more embodiments, when the carrier wave Mixk, which is modulated with the sensing signal $f_k$, is selected from the signals $\Phi_0$ and $\Phi_\pi$ during a certain burst, the sum signal supplied to the AD converter 15 and the digital data stream q outputted from the AD converter 15 comprise information of a signal component of the sensing signal $f_k$ effective for proximity sensing during the certain burst. In one or more embodiments, when the carrier wave Mixk is selected from the signals $\Phi_{\pi/2}$ and $\Phi_{-\pi/2}$ during a certain burst, the digital data stream q outputted from the AD converter 15 comprises information of a noise component of the sensing signal $f_k$ during the certain burst, in place of the component of the sensing signal $f_k$ effective for proximity sensing.

In one or more embodiments, the digital outputs of the decoder circuitry 16 are represented by an output tensor $b_x$. In one or more embodiments, the output tensor $b_x$ can be represented by the following expression (5):

$$b_x = XEa, \quad (5)$$

where X is a decode tensor which represents matrix operations performed on the digital data stream q by the decoder circuitry 16 during bursts #1 to #(2N).

In one or more embodiments, the decode tensor X can demodulate the input tensor a modulated with the encode tensor E when the product XE of the encode tensor E and the decode tensor X recited in expression (5) has only one non-zero element in each row.

In one or more embodiments, each of the carrier wave Mix1 to Mix(2N) is selected from the signals $\Phi_0$ and $\Phi_\pi$ during two or more of bursts #1 to #(2N) to suppress detection of a motion artifact. In one or more embodiments, this operation increases the number of sampling of information of effective signal components for proximity sensing per each sensing frame with a reduced number of the AD converter 15, while effectively suppressing detection of a motion artifact. In one or more embodiments, information of effective signal components for proximity sensing are sampled a plurality of times in each sensing frame, and this allows increasing an effective sampling frequency, suppressing detection of a motion artifact.

In one or more embodiments, each of the carrier waves Mix1 to Mix(2N) is selected from the signals $\Phi_0$ and $\Phi_\pi$ during two of more of the bursts #1 to #(2N), and accordingly there are two or more real elements in each column of the encode tensor E. In one or more embodiments, the product XE of the encode tensor E and the decode tensor X has one non-zero element in each row under such restriction, due to appropriate selection of the encode tensor E and the decode tensor X. In one or more embodiments, such selection of the encode tensor E and the decode tensor X is achieved through appropriate selection of the carrier waves Mix1 to Mix(2N) in the encoder circuitry 14 and appropriate design of the matrix operation performed in the decoder circuitry 16.

In one or more embodiments, the sampling timing of effective signal components for proximity sensing is evenly distributed in the time domain. In one or more embodiments, bursts in which the carrier wave Mixk, which is modulated with the sensing signal $f_k$, is selected from the signals $\Phi_0$ and $\Phi_\pi$ may be selected so that the selected bursts are not adjacent to each other in the time domain. In one or more embodiments, bursts in which the carrier wave Mixk is selected from the signals $\Phi_0$ and $\Phi_\pi$ and bursts in which the carrier wave Mixk is selected from the signals $\Phi_{\pi/2}$ and $\Phi_{-\pi/2}$ may be alternately disposed. This operation may effectively suppress detection of a motion artifact.

In one or more embodiments, sensing electrodes 3 from which information of effective signal components for proximity sensing may be spatially evenly distributed. In one or more embodiments, for a pair of carrier waves Mix(2p−1) and Mix(2p) modulated with sensing signals $f_{2p-1}$ and $f_{2p}$ associated with two sensing electrodes 3 spatially adjacent to each other, one of the carrier waves Mix(2p−1) and Mix(2p) is selected from the signals $\Phi_0$ and $\Phi_\pi$ in a burst in which the other is selected from the signals $\Phi_{\pi/2}$ and $\Phi_{-\pi/2}$. This operation may effectively suppress detection of a motion artifact.

In one or more embodiments, the noise detection may be achieved based on mixer outputs obtained by modulating the signal $\Phi_{\pi/2}$ or $\Phi_{-\pi/2}$ with the sensing signals $f_1$ to $f_Q$. In this case, the decoder circuitry 16 is designed to extract a noise component generated by modulating the signal $\Phi_{\pi/2}$ or $\pi_{-\pi/2}$ with the sensing signals $f_1$ to $f_Q$. In one or more embodiments, the timing at which information of noise components is obtained is evenly distributed in the time domain. In one or more embodiments, bursts in which the carrier wave Mixk, which is modulated with each sensing signal $f_k$, is selected from the signals $\Phi_{\pi/2}$ and $\Phi_{-\pi/2}$ are selected from bursts #1 to #(2N) so that the selected bursts are not adjacent in the time domain. In one or more embodiments, the carrier wave Mixk is selected from the signals $\Phi_{\pi/2}$ and $\Phi_{-\pi/2}$ in every one burst. In one or more embodiments, the timing of obtaining the noise components may be spatially evenly distributed. In one or more embodiments, for a pair of carrier waves Mix(2p−1) and Mix(2p) modulated with sensing signals $f_{2p-1}$ and $f_{2p}$ associated with two sensing electrodes 3 spatially adjacent to each other, one of the carrier waves Mix(2p−1) and Mix(2p) is selected from the signals $\Phi_0$ and $\Phi_\pi$ in a burst in which the other is selected from the signals $\Phi_{\pi/2}$ and $\Phi_{-\pi/2}$.

In one or more embodiments, the above-described conditions in which timing and positions for obtaining information of effective signal components and information of the noise components are evenly distributed can be described with an encode tensor E in which elements of real numbers and elements of pure imaginary numbers are arranged in a checkered pattern. In this case, the encode tensor E can be represented by the following expression (6a) with two encode matrices $E_1$ and $E_2$ represented by the following expressions (6b) and (6c), in one or more embodiments:

$$E = E_1 + iE_2, \tag{6a}$$

$$E_1 = \begin{pmatrix} e_{11} & 0 & \cdots & e_{1(2N-1)} & 0 \\ 0 & e_{22} & & 0 & e_{2(2N)} \\ \vdots & & \ddots & & \vdots \\ e_{(2N-1)1} & 0 & & e_{(2N-1)(2N-1)} & 0 \\ 0 & e_{(2N)2} & \cdots & 0 & e_{(2N)(2N)} \end{pmatrix}, \tag{6b}$$

and $$E_2 = \begin{pmatrix} 0 & e_{12} & \cdots & 0 & e_{1(2N)} \\ e_{21} & 0 & & e_{2(2N-1)} & 0 \\ \vdots & & \ddots & & \vdots \\ 0 & e_{(2N-1)2} & & 0 & e_{(2N-1)(2N)} \\ e_{(2N)1} & 0 & \cdots & e_{(2N)(2N-1)} & 0 \end{pmatrix}, \tag{6c}$$

where the element $e_{ij}$ of the encode matrix $E_1$ is a non-zero real number for i+j being an even number, and zero for i+j being an odd number, while the element $e_{ij}$ of the encode matrix $E_2$ is zero for i+j being an even number, and a non-zero real number for i+j being an odd number.

In one or more embodiments, the encode matrices $E_1$ and $E_2$ can be represented by the following expressions (7a) and (7b) for a case where N is two, that is, the number of the sensing electrodes 3 for one AD converter 15 is four:

$$E_1 = \begin{pmatrix} e_{11} & 0 & e_{13} & 0 \\ 0 & e_{22} & 0 & e_{24} \\ e_{31} & 0 & e_{33} & 0 \\ 0 & e_{42} & 0 & e_{44} \end{pmatrix}, \text{ and} \tag{7a}$$

-continued $$E_2 = \begin{pmatrix} 0 & e_{12} & 0 & e_{14} \\ e_{21} & 0 & e_{23} & 0 \\ 0 & e_{32} & 0 & e_{34} \\ e_{41} & 0 & e_{43} & 0 \end{pmatrix}. \quad (7b)$$

In one or more embodiments, a 2×2 matrix $O_{kl}$ in which one element is 1 and the remaining elements are 0 is defined by the following expression (8):

$$O_{kl} = \{\delta_{ik}\delta_{jl}\}, \quad (8)$$

where $\delta_{ij}$ is the Kronecker delta. In one or more embodiments, the matrices $O_{11}$, $O_{22}$, $O_{12}$, and $O_{21}$ are represented by the following expressions (9a) to (9d):

$$O_{11} = \begin{pmatrix} 1 & 0 \\ 0 & 0 \end{pmatrix}, \quad (9a)$$

$$O_{22} = \begin{pmatrix} 0 & 0 \\ 0 & 1 \end{pmatrix}, \quad (9b)$$

$$O_{12} = \begin{pmatrix} 0 & 1 \\ 0 & 0 \end{pmatrix}, \text{ and} \quad (9c)$$

$$O_{21} = \begin{pmatrix} 0 & 0 \\ 1 & 0 \end{pmatrix}. \quad (9d)$$

In one or more embodiments, a partial matrix $e_{kl}$, corresponding to the 2×2 matrix $O_{kl}$ is defined for an encode matrix by the following expression (10):

$$e_{kl} = \{e_{(k+2(i-2))(l+(2j-1))}\}, \quad (10)$$

where the partial matrix $e_{kl}$ is an N×N matrix.

In one or more embodiments, the encode matrices $E_1$ and $E_2$ can be represented with the partial matrix $e_{kl}$ and the matrix $O_{kl}$ by the following expressions (11a) and (11b):

$$E_1 = \begin{pmatrix} e_{11} & e_{13} & \cdots & e_{1(2N-1)} \\ e_{31} & e_{33} & & e_{3(2N-1)} \\ \vdots & & \ddots & \vdots \\ e_{(2N-1)1} & e_{(2N-1)3} & \cdots & e_{(2N-1)(2N-1)} \end{pmatrix} \otimes \begin{pmatrix} 1 & 0 \\ 0 & 0 \end{pmatrix} + \quad (11a)$$

$$\begin{pmatrix} e_{22} & e_{24} & \cdots & e_{2(2N)} \\ e_{42} & e_{44} & & e_{4(2N)} \\ \vdots & & \ddots & \vdots \\ e_{(2N)2} & e_{(2N)4} & \cdots & e_{(2N)(2N)} \end{pmatrix} \otimes \begin{pmatrix} 0 & 0 \\ 0 & 1 \end{pmatrix}$$

$$= e_{11} \otimes O_{11} + e_{22} \otimes O_{22},$$

and $$E_2 = \begin{pmatrix} e_{12} & e_{14} & \cdots & e_{1(2N)} \\ e_{32} & e_{34} & & e_{3(2N)} \\ \vdots & & \ddots & \vdots \\ e_{(2N-1)2} & e_{(2N-1)4} & \cdots & e_{(2N-1)(2N)} \end{pmatrix} \otimes \begin{pmatrix} 0 & 1 \\ 0 & 0 \end{pmatrix} + \quad (11b)$$

$$\begin{pmatrix} e_{21} & e_{23} & \cdots & e_{2(2N-1)} \\ e_{41} & e_{43} & & e_{4(2N-1)} \\ \vdots & & \ddots & \vdots \\ e_{(2N)1} & e_{(2N)3} & \cdots & e_{(2N)(2N-1)} \end{pmatrix} \otimes \begin{pmatrix} 0 & 0 \\ 1 & 0 \end{pmatrix}$$

$$= e_{12} \otimes O_{12} + e_{21} \otimes O_{21},$$

where the operator $\otimes$ is the Kronecker product.

In one or more embodiments, the encode matrices $E_1$ and $E_2$ can be represented by the following expressions (12a) and (12b) for a case where N is two, that is, the number of the sensing electrodes 3 for one AD converter 15 is four:

$$E_1 = \begin{pmatrix} e_{11} & e_{13} \\ e_{31} & e_{33} \end{pmatrix} \otimes \begin{pmatrix} 1 & 0 \\ 0 & 0 \end{pmatrix} + \begin{pmatrix} e_{22} & e_{24} \\ e_{42} & e_{44} \end{pmatrix} \otimes \begin{pmatrix} 0 & 0 \\ 0 & 1 \end{pmatrix}, \text{ and} \quad (12a)$$

$$E_2 = \begin{pmatrix} e_{12} & e_{14} \\ e_{32} & e_{34} \end{pmatrix} \otimes \begin{pmatrix} 0 & 1 \\ 0 & 0 \end{pmatrix} + \begin{pmatrix} e_{21} & e_{23} \\ e_{41} & e_{43} \end{pmatrix} \otimes \begin{pmatrix} 0 & 0 \\ 1 & 0 \end{pmatrix}. \quad (12b)$$

In one or more embodiments, the partial matrices $e_{11}$ and $e_{22}$ of the encode matrix $E_1$ and the partial matrices $e_{12}$ and $e_{21}$ of the encode matrix $E_2$ are 2×2 matrices, and it would be understood that expressions (11a) and (11b) hold for N being 2 when these partial matrices are defined by the following expressions (13a) to (13d):

$$e_{11} = \begin{pmatrix} e_{11} & e_{13} \\ e_{31} & e_{33} \end{pmatrix}, \quad (13a)$$

$$e_{22} = \begin{pmatrix} e_{22} & e_{24} \\ e_{42} & e_{44} \end{pmatrix}, \quad (13b)$$

$$e_{12} = \begin{pmatrix} e_{12} & e_{14} \\ e_{32} & e_{34} \end{pmatrix}, \text{ and} \quad (13c)$$

$$e_{21} = \begin{pmatrix} e_{21} & e_{23} \\ e_{41} & e_{43} \end{pmatrix}. \quad (13d)$$

In one or more embodiments, the encode tensor E is represented by the following expression (14):

$$E = \sum_m V_m \otimes E_m, \quad (14)$$

where the encode matrix $E_m$ corresponds to a basic linear transformation $V_m$.

In one or more embodiments the decode tensor X is represented by the following expression (15):

$$X = \sum_m W_m \otimes X_m, \quad (15)$$

where the decode matrix $X_m$ corresponds to a basic linear transformation $W_m$.

In this case, the output tensor $b_x$ is represented by the following expression (16), in one or more embodiments:

$$b_X - XEa_* = \left( \sum_{k=0}^{M-1} (V_{k+1}) \otimes \left( \sum_{m=1}^{k} X_{M-(k-m)} E_m \middle| \sum_{m=k+1}^{M} X_{(m-k)} E_m \right) \right) a - \quad (16)$$

$$(V_1 \otimes (X_1 E_1 + X_2 E_2)) a + (V_2 \otimes (-X_2 E_1 + X_1 E_2)) a.$$

In the final line of expression (16), M is selected as being 2. In this case, matrices $V_1$ and $V_2$ are selected as basic linear transformations for expression (14), and matrices $W_1$ and $W_2$ are selected as basic linear transformations for expression (15), where the matrices $V_1$ and $V_2$ are orthogonal to each other, and the matrices $W_1$ and $W_2$ are orthogonal to each other.

In one or more embodiments, the product XE of the encode tensor E and the decode tensor X is represented by the following expression (17):

$$XE = \sum_{k=0}^{M-1} (V_{k+1}) \otimes \left( -\sum_{m=1}^{k} X_{M-(k-m)} E_m + \sum_{m=k+1}^{M} X_{(m-k)} E_m \right) \quad (17)$$

$$= V_1 \otimes (X_1 E_1 + X_2 E_2) + V_2 \otimes (-X_2 E_1 + X_1 E_2).$$

In one or more embodiments, the decode tensor X can decode the input tensor a modulated with the encode tensor E when the product XE, which is represented by expression (17), has only one non-zero element in each row.

In one or more embodiments, the decode matrices $X_1$ and $X_2$ can be represented by the following expressions (18) and (19) with the matrix $O_{kl}$:

$$X_1 = \begin{pmatrix} x_{11} & x_{12} & & x_{1(2N)} \\ & & \cdots & \\ x_{21} & x_{22} & & x_{2(2N)} \\ \vdots & & \ddots & \vdots \\ x_{(2N)1} & x_{(2N)2} & \cdots & x_{(2N)(2N)} \end{pmatrix} = \quad (18)$$

$$\begin{pmatrix} x_{11} & x_{13} & & x_{1(2N-1)} \\ & & \cdots & \\ x_{31} & x_{33} & & x_{3(2N-1)} \\ \vdots & & \ddots & \vdots \\ x_{(2N-1)1} & x_{(2N-1)3} & \cdots & x_{(2N-1)(2N-1)} \end{pmatrix} \otimes \begin{pmatrix} 1 & 0 \\ 0 & 0 \end{pmatrix} +$$

$$\begin{pmatrix} x_{12} & x_{14} & & x_{1(2N)} \\ & & \cdots & \\ x_{32} & x_{34} & & x_{3(2N)} \\ \vdots & & \ddots & \vdots \\ x_{(2N-1)2} & x_{(2N-1)4} & \cdots & x_{(2N-1)(2N)} \end{pmatrix} \otimes \begin{pmatrix} 0 & 1 \\ 0 & 0 \end{pmatrix} +$$

$$\begin{pmatrix} x_{21} & x_{23} & & x_{2(2N-1)} \\ & & \cdots & \\ x_{41} & x_{43} & & x_{4(2N\,1)} \\ \vdots & & \ddots & \vdots \\ x_{(2N)1} & x_{(2N)3} & \cdots & x_{(2N)(2N-1)} \end{pmatrix} \otimes \begin{pmatrix} 0 & 0 \\ 1 & 0 \end{pmatrix} +$$

$$\begin{pmatrix} x_{22} & x_{24} & & x_{2(2N)} \\ & & \cdots & \\ x_{42} & x_{44} & & x_{4(2N)} \\ \vdots & & \ddots & \vdots \\ x_{(2N)2} & x_{(2N)4} & \cdots & x_{(2N)(2N)} \end{pmatrix} \otimes \begin{pmatrix} 0 & 0 \\ 0 & 1 \end{pmatrix} =$$

$$x_{11} \otimes O_{11} + x_{12} \otimes O_{12} + x_{21} \otimes O_{22} + x_{22} \otimes O_{22},$$

and $$X_2 = \begin{pmatrix} y_{11} & y_{12} & & y_{1(2N)} \\ & & \cdots & \\ y_{21} & y_{22} & & y_{2(2N)} \\ \vdots & & \ddots & \vdots \\ y_{(2N)1} & y_{(2N)2} & \cdots & y_{(2N)(2N)} \end{pmatrix} = \quad (19)$$

$$\begin{pmatrix} y_{11} & y_{13} & & y_{1(2N-1)} \\ & & \cdots & \\ y_{31} & y_{33} & & y_{3(2N-1)} \\ \vdots & & \ddots & \vdots \\ y_{(2N-1)1} & y_{(2N-1)3} & \cdots & y_{(2N-1)(2N-1)} \end{pmatrix} \otimes \begin{pmatrix} 1 & 0 \\ 0 & 0 \end{pmatrix} +$$

$$\begin{pmatrix} y_{12} & y_{14} & & y_{1(2N)} \\ & & \cdots & \\ y_{32} & y_{34} & & y_{3(2N)} \\ \vdots & & \ddots & \vdots \\ y_{(2N-1)2} & y_{(2N-1)4} & \cdots & y_{(2N-1)(2N)} \end{pmatrix} \otimes \begin{pmatrix} 0 & 1 \\ 0 & 0 \end{pmatrix} +$$

$$\begin{pmatrix} y_{21} & y_{23} & & y_{2(2N-1)} \\ & & \cdots & \\ y_{41} & y_{43} & & y_{4(2N\,1)} \\ \vdots & & \ddots & \vdots \\ y_{(2N)1} & y_{(2N)3} & \cdots & y_{(2N)(2N-1)} \end{pmatrix} \otimes \begin{pmatrix} 0 & 0 \\ 1 & 0 \end{pmatrix} +$$

$$\begin{pmatrix} y_{22} & y_{24} & & y_{2(2N)} \\ & & \cdots & \\ y_{42} & y_{44} & & y_{4(2N)} \\ \vdots & & \ddots & \vdots \\ y_{(2N)2} & y_{(2N)4} & \cdots & y_{(2N)(2N)} \end{pmatrix} \otimes \begin{pmatrix} 0 & 0 \\ 0 & 1 \end{pmatrix} =$$

$$y_{11} \otimes O_{11} + y_{12} \otimes O_{12} + y_{21} \otimes O_{22} + y_{22} \otimes O_{22},$$

where the matrices $x_{11}$, $x_{12}$, $x_{21}$, and $x_{22}$ in expressions (18) are partial matrices of the decode matrix $X_1$, and the matrices $y_{11}$, $y_{12}$, $y_{21}$, and $y_{22}$ in expressions (19) are partial matrices of the decode matrix $X_2$.

In one or more embodiments, due to the characteristics of the matrix $O_{kl}$, matrices which are included in the product XE of the encode tensor E and the decode tensor X and correspond to the basic linear transformations $V_1$ and $V_2$ are represented by the following expressions (20) and (21):

$$X_1 E_1 + X_2 E_2 = (x_{11}e_{11} + x_{12}e_{21}) \otimes O_{11} + (x_{12}e_{22} + x_{21}e_{11}) \\ \otimes O_{21} + (x_{22}e_{22}) \otimes O_{22} + (y_{12}e_{21}) \otimes O_{11} + (y_{11}e_{12}) \\ \otimes O_{12} + (y_{22}e_{21}) \otimes O_{21} + (y_{21}e_{12}) \otimes O_{22} = (x_{11}e_{11} + \\ y_{12}e_{21}) \otimes O_{11} + (x_{12}e_{22}y_{11}e_{12}) \otimes O_{12} + (x_{21}e_{11} + \\ y_{22}e_{21}) \otimes O_{21} + (x_{22}e_{22} + y_{21}e_{12}) \otimes O_{22}, \text{ and} \quad (20)$$

$$-X_2 E_1 + X_1 E_2 = (-y_{11}e_{11} + x_{12}e_{21}) \otimes O_{11} + (-y_{12}e_{22} + x_{11}e_{12}) \\ \otimes O_{12} + (-y_{21}e_{11} + x_{22}e_{21}) \otimes O_{21} + (-y_{22}e_{22}x_{21}e_{12}) \\ \otimes O_{22}. \quad (21)$$

In one or more embodiments, the following eight equations to be solved are obtained based on the above-described matrices corresponding to the basic linear transformations $V_1$ and $V_2$ from the condition that the product XE of the encode tensor E and the decode tensor X has only one non-zero element in each row:

$$x_{11}e_{11} + y_{12}e_{21} = c_1 \delta_{1g} O_{11} + c_2 \delta_{1g} O_{22},$$

$$x_{12}e_{22} + y_{11}e_{12} = c_3 \delta_{2g} O_{11} + c_4 \delta_{2g} O_{22},$$

$$-y_{11}e_{11} + x_{12}e_{21} = c_5 \delta_{3g} O_{11} + c_6 \delta_{3g} O_{22},$$

$$-y_{12}e_{22} + x_{11}e_{12} = c_7 \delta_{4g} O_{11} + c_8 \delta_{4g} O_{22},$$

$x_{21}e_{11}+y_{22}e_{21}=c_9\delta_{1h}O_{11}+c_{10}\delta_{1h'}O_{22}$, $x_{22}e_{22}+y_{21}e_{12}=c_{11}\delta_{2h}O_{11}+c_{12}\delta_{2h'}O_{22}$, $-y_{21}e_{11}+x_{22}e_{21}=c_{13}\delta_{3h}O_{11}+c_{14}\delta_{3h'}O_{22}$, and $-y_{22}e_{22}+x_{21}e_{12}=c_{15}\delta_{4h}O_{11}+c_{16}\delta_{4h'}O_{22}$, (22)

where $c_1$ to $c_{16}$ are arbitrary constants, and g, g', h, and h' are any integer from one to four.

In one or more embodiments, when there is a solution to the eight equations (22), the product XE of the encode tensor E and the decode tensor X has only one non-zero element in each row, allowing demodulation of the input tensor a. In one embodiment, the partial matrices $e_{11}$, $e_{12}$, $e_{21}$, and $e_{22}$ of the encode matrices $E_1$ and $E_2$ are equal to an arbitrary regular matrix e, that is, it holds:

$e_{11}=e_{12}=e_{21}=e_{22}=e$, (23)

and the following expressions (24a) and (24b) hold for the partial matrices $x_{11}$, $x_{12}$, $x_{21}$, and $x_{22}$ of the decode matrix $X_1$ and the partial matrices $y_{11}$, $y_{12}$, $y_{21}$ and $y_{22}$ of the decode matrix $X_2$:

$x_{11}=y_{12}=x_{21}=-y_{22}=2(e)^{-1}$, and (24a)

$-y_{11}=x_{12}=y_{21}=x_{22}=2(e)^{-1}$. (24b)

In one or more embodiments, the input tensor a is reproduced as the output tensor $b_x$ through selecting the partial matrices of the encode matrices $E_1$ and $E_2$ and the decode matrices $X_1$ and $X_2$ so as to satisfy the above-described expressions (23), (24a) and (24b). In one or more embodiments, this allows obtaining information of the signal levels $A_1$ to $A_{2N}$ of the sensing signals $f_1$ to $f_{2N}$ as the digital outputs of the decode circuitry 16.

In one or more embodiments, the solution space of the eight equations (22) is narrowed by adding constraint conditions. In one or more embodiments, the circuit size of the decoder circuitry 16 is additionally reduced by appropriately defining the constraint conditions.

In one or more embodiments, the decode matrices are selected so that two or more different basic linear transformations do not appear in each column, and thereby the number of linear transformation circuits simultaneously operate in the decoder circuitry 16 is reduced to one. This is advantageous in terms of the circuit size and the control logic size.

In one or more embodiments, the variable matrices related to the decode matrices $X_1$ and $X_2$ are degenerated by using matrices $X_{1a}$ and $X_{2a}$ as the decode matrices $X_1$ and $X_2$ so that only four matrices $x_{11}$, $x_{21}$, $y_{12}$, and $y_{22}$ are variable matrices, where the matrix $X_{1a}$ is defined so that the elements in the even columns are zero as recited in expression (25), and the matrix $X_{2a}$ is defined so that the elements in the odd columns are zero as recited in expression (26):

$$X_{1a} = \begin{pmatrix} x_{11} & 0 & x_{1(2N-1)} & 0 \\ & \cdots & & \\ x_{21} & 0 & x_{2(2N-1)} & 0 \\ \vdots & & \ddots & \vdots \\ x_{(2N-1)1} & 0 & x_{(2N-1)(2N-1)} & 0 \\ & \cdots & & \\ x_{(2N)1} & 0 & x_{(2N)(2N-1)} & 0 \end{pmatrix} = x_{11} \otimes O_{11} + x_{21} \otimes O_{21},$$ (25)

and $$X_{2a} = \begin{pmatrix} 0 & y_{12} & 0 & y_{1(2N)} \\ & \cdots & & \\ 0 & y_{22} & 0 & y_{2(2N)} \\ \vdots & & \ddots & \vdots \\ 0 & y_{(2N-1)2} & 0 & y_{(2N-1)(2N)} \\ & \cdots & & \\ 0 & y_{(2N)2} & 0 & y_{(2N)(2N)} \end{pmatrix} = y_{12} \otimes O_{12} + y_{22} \otimes O_{22}.$$ (26)

In this case, the matrices which are included in the product XE and correspond to the basic linear transformations $V_1$ and $V_2$ are represented by the following expressions (27) and (28), in one or more embodiments:

$X_{1a}E_1+X_{2a}E_2=(x_{11}e_{11}+y_{12}e_{21})\otimes O_{11}+(x_{21}e_{11}+y_{22}e_{21})\otimes O_{21}$, and (27)

$-X_{2a}E_1+X_{1a}E_2=(-y_{12}e_{22}+x_{11}e_{12})\otimes O_{12}+(-y_{22}e_{22}+x_{21}e_{12})\otimes O_{22}$. (28)

In one or more embodiments, the condition to reproduce the input tensor a, that is, the condition that the product XE of the encode tensor E and the decode tensor X has only one non-zero element in each row can be more restricted as recited in expressions (29):

$x_{11}e_{11}+y_{12}e_{21}=c_1\delta_{1g}I$, $-y_{12}e_{22}+x_{11}e_{12}=c_2\delta_{2g}I$, $x_{21}e_{11}+y_{22}e_{21}=c_3\delta_{2g}I$, and $-y_{22}e_{22}+x_{21}e_{12}=c_4\delta_{1g}I$, (29)

where I is the unit matrix, $c_1$, $c_2$, $c_3$, and $c_4$ are arbitrary constants, and g is an integer of 1 or 2. This is based on the fact that, if a plurality of non-zero elements appear in the same row of the matrices corresponding to the basic linear transformations $V_1$ and $V_2$, this is a valueless and redundant decode result.

There actually exists a solution to the four equations (29), although the solution is non-unique because of the existence of eight variable matrices and one variable g. For example, the partial matrices $e_{11}$, $e_{21}$, $e_{12}$, $e_{22}$, $x_{11}$, $x_{21}$, $y_{12}$, and $y_{22}$ satisfying the expressions (23) and (24a) are a solution to the four equations (29).

In one or more embodiments, the variable matrices related the decode matrices $X_1$ and $X_2$ are degenerated by using matrices $X_{1b}$ and $X_{2b}$ as the decode matrices $X_1$ and $X_2$ so that only four matrices $x_{12}$, $x_{22}$, $y_{11}$, and $y_{21}$ are variable matrices, where the matrix $X_{1b}$ is defined so that the elements in the odd columns are zero as recited in expression (30) and the matrix $X_{2b}$ is defined so that the elements in the even columns are zero as recited in expression (31):

$$X_{1b} = \begin{pmatrix} 0 & x_{12} & 0 & x_{1(2N)} \\ & \cdots & & \\ 0 & x_{22} & 0 & x_{2(2N)} \\ \vdots & & \ddots & \vdots \\ 0 & x_{(2N-1)2} & 0 & x_{(2N-1)(2N)} \\ & \cdots & & \\ 0 & x_{(2N)2} & 0 & x_{(2N)(2N)} \end{pmatrix} = x_{12} \otimes O_{12} + x_{22} \otimes O_{22},$$ (30)

and

-continued $$X_{2b} = \begin{pmatrix} y_{11} & 0 & & y_{1(2N-1)} & 0 \\ & & \cdots & & \\ y_{21} & 0 & & y_{2(2N-1)} & 0 \\ \vdots & & \ddots & \vdots & \\ y_{(2N-1)1} & 0 & & y_{(2N-1)(2N-1)} & 0 \\ & & \cdots & & \\ y_{(2N)1} & 0 & & y_{(2N)(2N-1)} & 0 \end{pmatrix} = y_{11} \otimes O_{11} + y_{21} \otimes O_{21}.$$ (31)

In this case, the matrices which are included in the product XE and correspond to the basic linear transformations $V_1$ and $V_2$ are represented by the following expressions (32) and (33), in one or more embodiments:

$$X_{1b}E_1 + X_{2b}E_2 = (x_{12}e_{22} + y_{11}e_{12}) \otimes O_{12} + (x_{22}e_{22} + y_{21}e_{12}) \otimes O_{22}, \text{ and} \quad (32)$$

$$-X_{2b}E_1 + X_{1b}E_2 = (-y_{11}e_{11} + x_{12}e_{21}) \otimes O_{11} + (-y_{21}e_{11} + x_{22}e_{21}) \otimes O_{21}. \quad (33)$$

In one or more embodiments, the condition to demodulate the input tensor a, that is, the condition that the product XE of the encode tensor E and the decode tensor X has only one non-zero element in each row can be more restricted as recited in expressions (34):

$$-y_{11}e_{11} + x_{12}e_{21} = c_5 \delta_{1g} I,$$

$$x_{12}e_{22} + y_{11}e_{12} = c_6 \delta_{2g} I,$$

$$-y_{21}e_{11} + x_{22}e_{21} = c_7 \delta_{2g} I, \text{ and}$$

$$x_{22}e_{22} + y_{21}e_{12} = c_8 \delta_{1g} I. \quad (34)$$

There actually exists a solution to the four equations (34), although the solution is non-unique due to the existence of eight variable matrices and one variable g. For example, the partial matrices $e_{11}$, $e_{21}$, $e_{12}$, $e_{22}$, $x_{12}$, $x_{22}$, $y_{11}$ and $y_{21}$ satisfying the expressions (23) and (24b) are a solution to the four equations (34).

In one or more embodiments, after a solution satisfying the expression (22), (29) or (34) is obtained, the encoder circuitry 14 is designed to select the carrier waves Mix1 to Mix(2N) based on the encode tensor E of the obtained solution, and the decoder circuitry 16 is designed to perform product-sum operations in accordance with the decode tensor X of the obtained solution.

The values $q_1$ to $q_{2N}$ of the digital data stream q outputted from the AD converter 15, which are represented by expression (4), incorporate information of noise components as well as information of the effective signal components, where the effective signal components correspond to information generated by modulating the signals $\Phi_0$ and $\Phi_{90}$ with the sensing signal $f_1$ to $f_{2N}$, and the noise components correspond to information generated by modulating the signals $\Phi_{\pi/2}$ and $\Phi_{-\pi/2}$ with the sensing signal $f_1$ to $f_{2N}$. In one or more embodiments, noise detection may be achieved by designing the decoder circuitry 16 to extract information generated by modulating the signals $\Phi_{\pi/2}$ and $\Phi_{-\pi/2}$ with the sensing signals $f_1$ to $f_{2N}$.

To extract information generated by modulating carrier waves having phases different from the phases of the signals $\Phi_0$ and $\Phi_\pi$, for example, the signals $\Phi_{\pi/2}$ and $\Phi_{-\pi/2}$, with the sensing signals $f_1$ to $f_{2N}$ in addition to information generated by modulating the signals $\Phi_0$ and $\Phi_\pi$ with the sensing signals $f_1$ to $f_{2N}$, in one or more embodiments, decode matrices $X_a$ and $X_b$ obtained by the following expressions (35) from the decode matrices $X_{1a}$ and $X_{2a}$ and the decode matrices $X_{1b}$ and $X_{2b}$ may be used in the decoder circuitry 16, where the decode matrices $X_{1a}$ and $X_{2a}$ are a solution to equation (29) and the decode matrices $X_{1b}$ and $X_{2b}$ are a solution to equation (34):

$$X_a = X_{1a} - iX_{2a}, \text{ and}$$

$$X_b = X_{1b} - iX_{2b}. \quad (35)$$

In one or more embodiments, the decode matrix $X_a$ is applied to the digital data stream q to obtain the output tensor $b_x$ so that odd elements thereof correspond to information generated by modulating the signal $\Phi_0$ or $\Phi_\pi$ with the sensing signals $f_1$ to $f_{2N}$, that is, information of effective signal components, and even elements thereof correspond to information generated by modulating the signal $\Phi_{\pi/2}$ or $\Phi_{-\pi/2}$ with the sensing signals $f_1$ to $f_{2N}$, that is, information of noise components. In one or more embodiments, the decode matrix $X_b$ is applied to the digital data stream q to obtain the output tensor $b_x$ so that odd elements thereof correspond to information of noise components, and even elements thereof correspond to information of effective signal components. In one or more embodiments, the decode matrices $X_a$ and $X_b$ are applied to the digital data stream q outputted from the AD converter 15 in the decoder circuitry 16 to obtain digital outputs corresponding to the effective signal components and digital outputs corresponding to the noise components.

In one or more embodiments, the processing unit 5 may be configured to achieve proximity sensing based on the digital outputs corresponding to the effective signal components and achieve noise detection based on the digital outputs corresponding to the noise components. In one or more embodiments, when detecting existence of noise based on the digital outputs corresponding to the noise components in a sensing frame, the processing unit 5 may discard data of the digital outputs corresponding to the effective signal components obtained for this sensing frame. In such an embodiment, proximity sensing of an object to the sensor array 1 may be achieved based on the digital outputs corresponding to the effective signal components obtained in a sensing frame for which no noise is detected.

The above-described techniques of this disclosure is applicable to a case where Q is an odd number of three or more, for example, a case where Q is 2N−1 for N being an integer of two or more. In this case, a similar calculation to that described above is performed with an assumption that the signal level $A_{2N}$ of the sensing signal $f_{2N}$ is zero during all of bursts #1 to #(2N), in one or more embodiments. In one or more embodiments, the calculation result with respect to the sensing signal $f_{2N}$ is discarded in the decoder circuitry 16.

In one or more embodiments the capacitive sensing circuitry 4 is configured based on a solution for a case where Q=4 and N=2, that is, one AD converter 15 is prepared for four sensing electrodes 3.

When N=2, the encode tensor E is a 4×4 matrix and the encode matrices $E_1$ and $E_2$ are represented by expressions (7a) and (7b), in one or more embodiments. In one or more embodiments, the partial matrices $e_{11}$, $e_{12}$, $e_{21}$, and $e_{22}$ of the encode matrices $E_1$ and $E_2$, the partial matrices $x_{11}$, $x_{21}$, $x_{12}$, and $x_{22}$ of the decode matrix $X_1$, and the partial matrices $y_{11}$, $y_{21}$, $y_{12}$, and $y_{22}$ of the decode matrix $X_2$ are all 2×2 matrices.

In one or more embodiments, all of the elements of the encoder matrices $E_1$ and $E_2$ are selected from +1 or −1 to eliminate a need for providing a variable gain stage for the encoder circuitry 14. This may be advantageous in terms of the circuit size. In one or more embodiments, a similar approach may be applied to the decode matrices $X_1$ and $X_2$ and the decoder circuitry 16. In view of this, in one or more embodiments, the partial matrices $e_{11}$, $e_{12}$, $e_{21}$, and $e_{22}$ of the encode matrices $E_1$ and $E_2$, the partial matrices $x_{11}$, $x_{21}$, $x_{12}$, and $x_{22}$ of the decode matrix $X_1$, and the partial matrices $y_{11}$, $y_{21}$, $y_{12}$, and $y_{22}$ of the decode matrix $X_2$ are selected from 16 2×2 matrices defined by the following expressions (36):

$$\pm M_0 = \pm \begin{pmatrix} 1 & 1 \\ 1 & 1 \end{pmatrix},$$

$$\pm M_1 = \pm \begin{pmatrix} 1 & -1 \\ -1 & 1 \end{pmatrix},$$

$$\pm M_2 = \pm \begin{pmatrix} 1 & -1 \\ 1 & -1 \end{pmatrix},$$

$$\pm M_3 = \pm \begin{pmatrix} 1 & 1 \\ -1 & -1 \end{pmatrix},$$

$$\pm M_4 = \pm \begin{pmatrix} 1 & 1 \\ 1 & -1 \end{pmatrix},$$

$$\pm M_5 = \pm \begin{pmatrix} -1 & 1 \\ 1 & 1 \end{pmatrix},$$

$$+ M_6 = + \begin{pmatrix} 1 & -1 \\ 1 & 1 \end{pmatrix},$$

and $$\perp M_7 = \perp \begin{pmatrix} 1 & 1 \\ -1 & 1 \end{pmatrix}.$$
(36)

In one or more embodiments, the partial matrices of the encode matrices and the decode matrices are all defined as being regular to simplify the calculation; this allows handling the partial matrices of the decode matrices as integer multiples of the inverse matrices of the partial matrices of the encode matrices. In one or more embodiments, the solution space is accordingly restricted in accordance with the following expressions (37) and (38):

$$e_{kl} \in \{\pm M_4, \pm M_5, \pm M_6, \pm M_7\},$$ (37)

$$x_{kl} \in \{\pm M_4, \pm M_5, \pm M_6, \pm M_7\}, \text{ and}$$

$$y_{kl} \in \{\pm M_4, \pm M_5, \pm M_6, \pm M_7\}.$$ (38)

In one or more embodiments, the restriction of the solution space with respect to the partial matrices $x_{kl}$ and $y_{kl}$ of the decode matrices is based on the relations recited in expressions (39):

$$\pm M_4 = \pm 2(M_4)^{-1},$$

$$+ M_5 = \pm 2(M_5)^{-1},$$

$$\pm M_6 = \pm 2(M_7)^{-1}, \text{ and}$$

$$\perp M_7 = \pm 2(M_6)^{-1}.$$ (39)

In one or more embodiments, for the case where the partial matrices of the encode matrices are regular, g=1, and $c_1 = c_2 = c_3 = c_4 = 4$, one of the most simple examples of the partial matrices of the encode matrices and the decode matrices satisfying the following expressions (40) is represented by the following expressions (41):

$$x_{11}e_{11} + y_{12}e_{21} = c_1 \delta_{1g} I,$$

$$-y_{12}e_{22} + x_{11}e_{12} = c_2 \delta_{2g} I,$$

$$x_{21}e_{11} + y_{22}e_{21} = c_3 \delta_{2g} I,$$

$$-y_{22}e_{22} + x_{21}e_{12} = c_4 \delta_{1g} I,$$ (40)

$$e_{22} = e_{21} = e_{12} = e_{11},$$

$$x_{11} = y_{12} = x_{21} = (e_{11})^{-1}, \text{ and}$$

$$y_{22} = -(e_{11})^{-1}.$$ (41)

In one or more embodiments, the solution space is restricted in accordance with expressions (37) and (38). In such an embodiment, with respect to partial matrices of the encode matrices and partial matrices of the decode matrices, a sum or difference of two matrix products becomes an integer multiple of the unit matrix only when the two matrix products are each an integer multiple of the unit matrix. In one or more embodiments, expression (22) can be accordingly rewritten into the following expressions (42) for g being 1:

$$x_{11}e_{11} + y_{12}e_{21} = c_1 I,$$

$$-y_{12}e_{22} + x_{11}e_{12} = 0,$$

$$x_{12}e_{11} + y_{22}e_{21} = 0,$$

$$-y_{22}e_{22} + x_{21}e_{12} = c_4 I,$$

$$-y_{11}e_{11} + x_{12}e_{21} = c_5 I,$$

$$x_{12}e_{22} + y_{11}e_{12} = 0,$$

$$-y_{21}e_{11} + x_{22}e_{21} = 0, \text{ and}$$

$$x_{22}e_{22} + y_{21}e_{12} = c_8 I.$$ (42)

In one or more embodiments, the following expressions (43) can be obtained from expressions (42):

$$x_{11} = 2(e_{11})^{-1},$$

$$-y_{11} = 2(e_{11})^{-1} = x_{11},$$

$$x_{12} = 2(e_{21})^{-1},$$

$$y_{12} = 2(e_{21})^{-1} = x_{12},$$

$$x_{21} = 2(e_{12})^{-1},$$

$$y_{21} = 2(e_{12})^{-1} = x_{21},$$

$$x_{22} = 2(e_{22})^{-1},$$

$$y_{22} = 2(e_{22})^{-1} = x_{22},$$

$$c_1 = 4,$$

$$c_2 = 4,$$

$$c_3 = 4, \text{ and}$$

$$c_4 = 4.$$ (43)

In one or more embodiments, coefficients of 2 appear in expressions (43), because partial matrices of the decode matrices have coefficients of 2, when the partial matrices of the decode matrices are integer multiples of the partial matrices of the encode matrices.

In one or more embodiments, the following four equations (44) in which the right sides are zero matrices are equivalent to one another:

$-y_{12}e_{22}+x_{11}e_{12}=0$, $x_{21}e_{11}+y_{22}e_{21}=0$, $x_{12}e_{22}+y_{11}e_{12}=0$, and $y_{21}e_{11}+x_{22}e_{21}=0$, (44)

because, when products of regular matrices are equal, the inverse matrices thereof are equal. In one or more embodiments, this equivalence is obtained from the following expressions (45) and (46):

$x_{11}e_{12}=y_{12}e_{22}$, $(x_{11}e_{12})^{-1}=(y_{12}e_{22})^{-1}$, $(e_{12})^{-1}(x_{11})^{-1}=(e_{22})^{-1}(y_{12})^{-1}$, $x_{21}e_{11}=-y_{22}e_{21}$, (45)

$-y_{11}=x_{11}$, $x_{12}=y_{12}$, $y_{21}=x_{21}$, and $x_{22}=-y_{22}$. (46)

In one or more embodiments, based on this equivalence, a solution is obtained by searching two pairs of regular 2×2 matrices for which the matrix products are equal to each other. In one or more embodiments, there is a plurality of pairs satisfying this requirement.

Because of the characteristics of a matrix product, a matrix product remains unchanged even when two columns of the multiplying matrix and two rows of the matrix to be multiplied are exchanged at the same time. Furthermore, a matrix product remains unchanged even when the sign of a column of the multiplying matrix and signs of corresponding two rows of the matrix to be multiplied are inverted at the same time. With respect to solutions related to partial matrices $e_k$, of the encode matrices to be multiplied, based on the relationships represented by the following expressions (47):

$$\pm M_4 = \pm \begin{pmatrix} 0 & 1 \\ 1 & 0 \end{pmatrix} M_6,$$

$$\pm M_4 = \pm \begin{pmatrix} 0 & -1 \\ 1 & 0 \end{pmatrix} M_5,$$

and $$\pm M_4 = \pm \begin{pmatrix} 1 & 0 \\ 0 & -1 \end{pmatrix} M_7,$$ (47)

if one of the simplest solution representable by the following expression (48) is obtained, remaining solutions are readily obtained, in one or more embodiments:

$e_{kl}=M_4$. (48)

For example, when a solution is selected to satisfy the following expressions (49), the sum of the row sums of two encode matrices always becomes two:

$e_{11}=M_4$, $e_{12}=M_5$, $e_{21}=M_6$, $e_{22}=M_7$, $x_{11}=M_4$, $y_{12}=M_7$, $x_{21}=M_5$, $-y_{22}=M_6$, $-y_{11}=M_4$, $x_{12}=M_7$, $y_{21}=M_5$, and $x_{22}=M_6$, (49)

Expressions (49) represents one of solutions which allows demodulating the input tensor a.

As a detailed representation of the solution represented by expression (49), the encode tensor E and the decode matrices $X_a$ and $X_b$ can be represented by the following expressions (50) and (51), in one or more embodiments:

$$E = E_1 + iE_2$$

$$= \begin{pmatrix} 1 & 0 & 1 & 0 \\ 0 & 1 & 0 & 1 \\ 1 & 0 & -1 & 0 \\ 0 & -1 & 0 & 1 \end{pmatrix} + i \begin{pmatrix} 0 & -1 & 0 & 1 \\ 1 & 0 & -1 & 0 \\ 0 & 1 & 0 & 1 \\ 1 & 0 & 1 & 0 \end{pmatrix},$$ (50)

$$X_a = X_{1a} - iX_{2a}$$

$$= \begin{pmatrix} 1 & 0 & 1 & 0 \\ -1 & 0 & 1 & 0 \\ 1 & 0 & -1 & 0 \\ 1 & 0 & 1 & 0 \end{pmatrix} - i \begin{pmatrix} 0 & 1 & 0 & 1 \\ 0 & -1 & 0 & 1 \\ 0 & -1 & 0 & 1 \\ 0 & -1 & 0 & -1 \end{pmatrix},$$

and $$X_b = X_{1b} - iX_{2b}$$

$$= \begin{pmatrix} 0 & 1 & 0 & 1 \\ 0 & 1 & 0 & -1 \\ 0 & -1 & 0 & 1 \\ 0 & 1 & 0 & 1 \end{pmatrix} - i \begin{pmatrix} -1 & 0 & -1 & 0 \\ -1 & 0 & 1 & 0 \\ -1 & 0 & 1 & 0 \\ 1 & 0 & 1 & 0 \end{pmatrix}.$$ (51)

In one or more embodiments, the products of the decode matrices $X_a$ and $X_b$ and the encode tensor E can be represented by the following expression (52):

$$X_a E = \begin{pmatrix} 4 & 0 & 0 & 0 \\ 0 & 0 & 0 & 0 \\ 0 & 0 & 4 & 0 \\ 0 & 0 & 0 & 0 \end{pmatrix} + i \begin{pmatrix} 0 & 0 & 0 & 0 \\ 0 & 4 & 0 & 0 \\ 0 & 0 & 0 & 0 \\ 0 & 0 & 0 & 4 \end{pmatrix},$$

and $$X_b E = \begin{pmatrix} 0 & 0 & 0 & 0 \\ 0 & 4 & 0 & 0 \\ 0 & 0 & 0 & 0 \\ 0 & 0 & 0 & 4 \end{pmatrix} + i \begin{pmatrix} 4 & 0 & 0 & 0 \\ 0 & 0 & 0 & 0 \\ 0 & 0 & 4 & 0 \\ 0 & 0 & 0 & 0 \end{pmatrix}.$$ (52)

Figure 4:
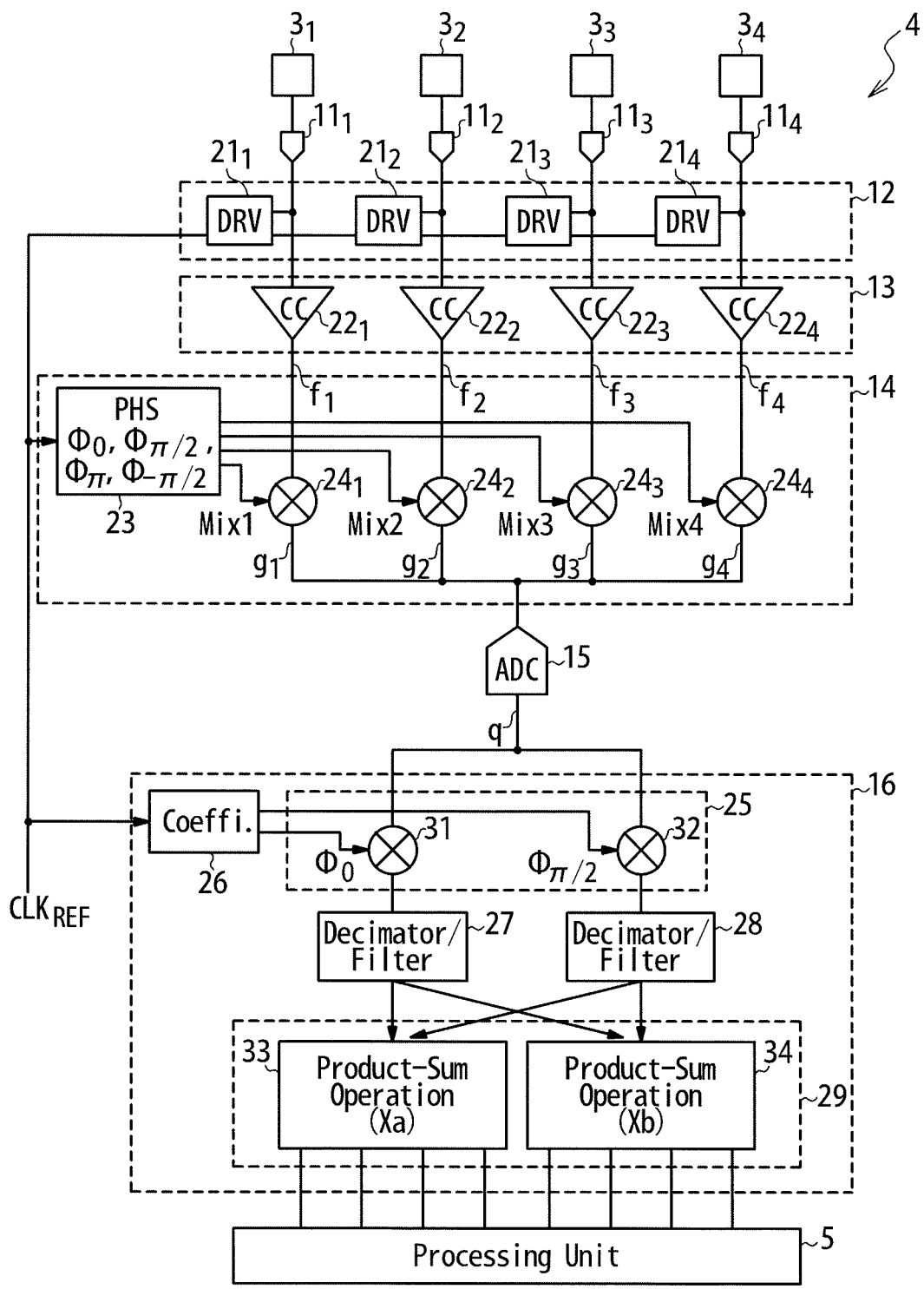
FIG. 4 is a circuit diagram illustrating an example configuration of capacitive sensing circuitry, according to one or more embodiments.

In one or more embodiments, as illustrated in FIG. 4, the encoder circuitry 14 is configured in accordance with expression (50), and the decoder circuitry 16 is configured in accordance with expression (51), where four sensing electrodes 3 are prepared for one AD converter 15, that is, Q=4, and the encoder circuitry 14 comprises four mixers 24₁ to 24₄ receiving carrier waves Mix1 to Mix4, respectively.

In one or more embodiments, the decoder circuitry 16 comprises a digital demodulator 25, coefficient supplying circuitry 26, decimeter/filters 27 and 28, and a decoder 29. In one or more embodiments, the digital demodulator 25 is configured to demodulate the digital data stream q with an in-phase local carrier which is in phase with the drive signals and an out-of-phase local carrier having a phase shifted from that of the in-phase local carrier by $\pi/2$. In one or more embodiments, the digital demodulator 25 comprises digital mixers 31 and 32. In one or more embodiments, the digital mixer 31 is configured to multiply the digital data stream q by coefficients $\Phi_0$ corresponding to the in-phase local carrier, and the digital mixer 32 is configured to multiply the digital data stream q by coefficients $\Phi_{\pi/2}$ corresponding to the out-of-phase local carrier, which has a phase delayed from that of the in-phase local carrier by $\pi/2$. In one or more embodiments, the coefficient supplying circuitry 26 is configured to supply the coefficients $\Phi_0$ to the digital mixer 31 and the coefficients $\Phi_{\pi/2}$ to the digital mixer 32, in synchronization with a reference clock signal $CLK_{REF}$.

In one or more embodiments, the decoder 29 comprises product-sum operation circuitries 33 and 34. In one or more embodiments, the product-sum operation circuitry 33 is configured to perform a product-sum operation corresponding to the decode matrix $X_a$, and the product-sum operation circuitry 34 is configured to perform a product-sum operation corresponding to the decode matrix $X_b$.

In one or more embodiments, the decimeter/filter 27 is configured to distribute the output of the digital mixer 31 to the product-sum operation circuitries 33 and 34, and the decimeter/filter 28 is configured to distribute the output of the digital mixer 32 to the product-sum operation circuitries 33 and 34.

In one or more embodiments, Q=4, that is, N=2 and the driver circuitry 12 supplies drive signals to the sensing electrodes 3₁ to 3₄ so that the waveform of the drive signals remains unchanged over bursts #1 to #4.

Figure 5:
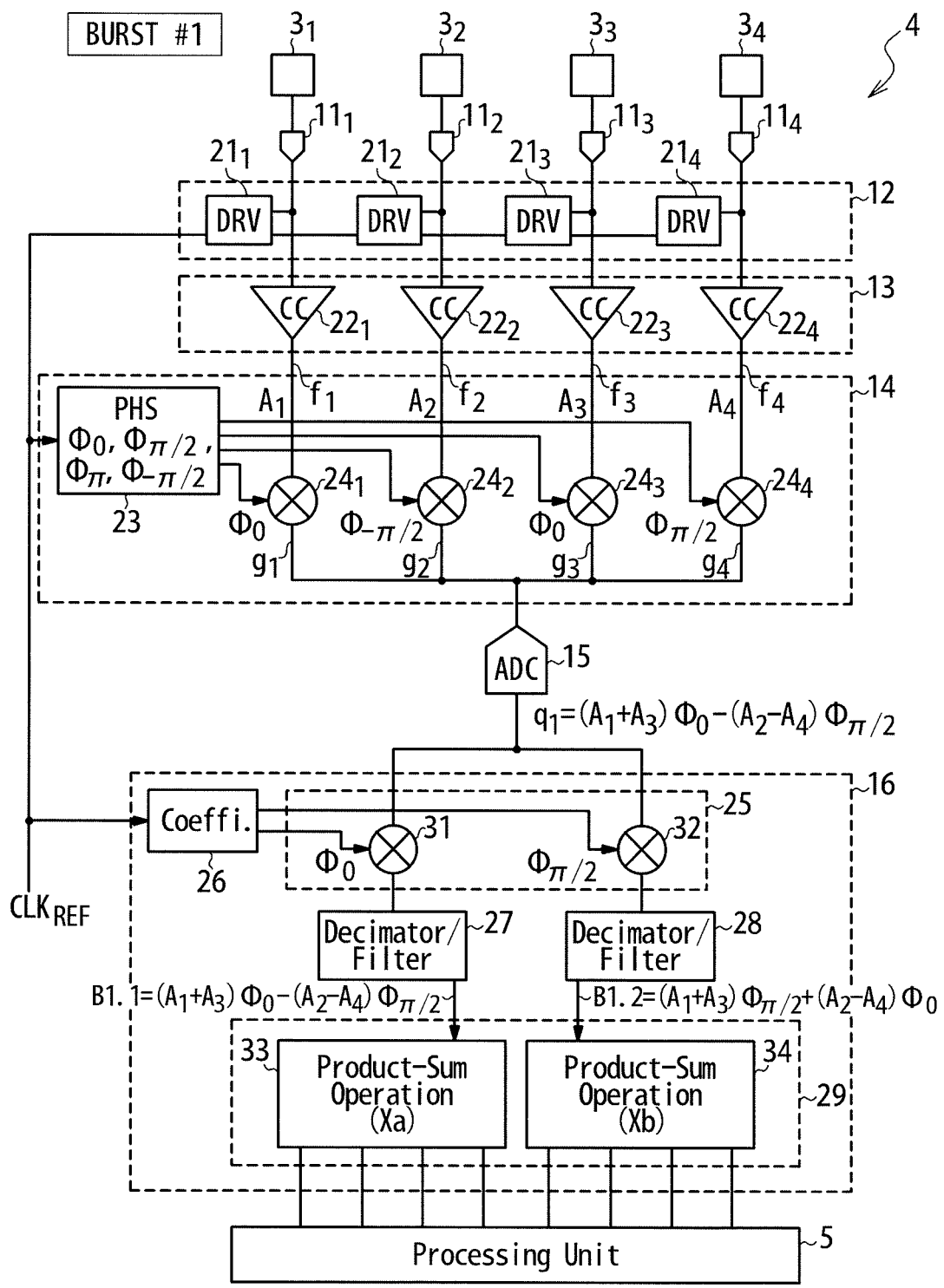
FIGS. 5, 6, 7, and 8 are circuit diagrams illustrating an example operation of the capacitive sensing circuitry, according to one or more embodiments.

In one or more embodiments, as illustrated in FIG. 5, the mixers 24₁ to 24₄ use the signals $\Phi_0$, $\Phi_{-\pi/2}$, $\Phi_0$, and $\Phi_{\pi/2}$ as the carrier waves Mix1 to Mix4, respectively, and modulate the carrier waves Mix1 to Mix4 with the sensing signals $f_1$ to $f_4$, respectively, during burst #1. In one or more embodiments, this operation corresponds to the first row of the encode matrices $E_1$ and $E_2$ in equation (50). In one or more embodiments, the value $q_1$ of the digital data stream q outputted from the AD converter 15 during burst #1 is given by the following expression (53):

$$q_1=(A_1+A_3)\Phi_0-(A_2-A_4)\Phi_{\pi/2}. \tag{53}$$

In one or more embodiments, the digital mixers 31 and 32 outputs demodulated data B1.1 and B1.2 obtained by multiplying $q_1$ by the coefficients $\Phi_0$ and $\Phi_{\pi/2}$, respectively. In one or more embodiments, the demodulated data B1.1 and B1.2 can be represented by the following expressions (54a) and (54b):

$$B1.1=(A_1+A_3)\Phi_0-(A_2-A_4)\Phi_{\pi/2}, \text{ and} \tag{54a}$$

$$B1.2=(A_1+A_3)\Phi_{\pi/2}+(A_2-A_4)\Phi_0. \tag{54b}$$

In one or more embodiments, the decimeter/filter 27 outputs the demodulated data B1.1 received from the digital mixer 31 to the product-sum operation circuitry 33, and the decimeter/filter 28 outputs the demodulated data B1.2 received from the digital mixer 32 to the product-sum operation circuitry 34.

Figure 6:
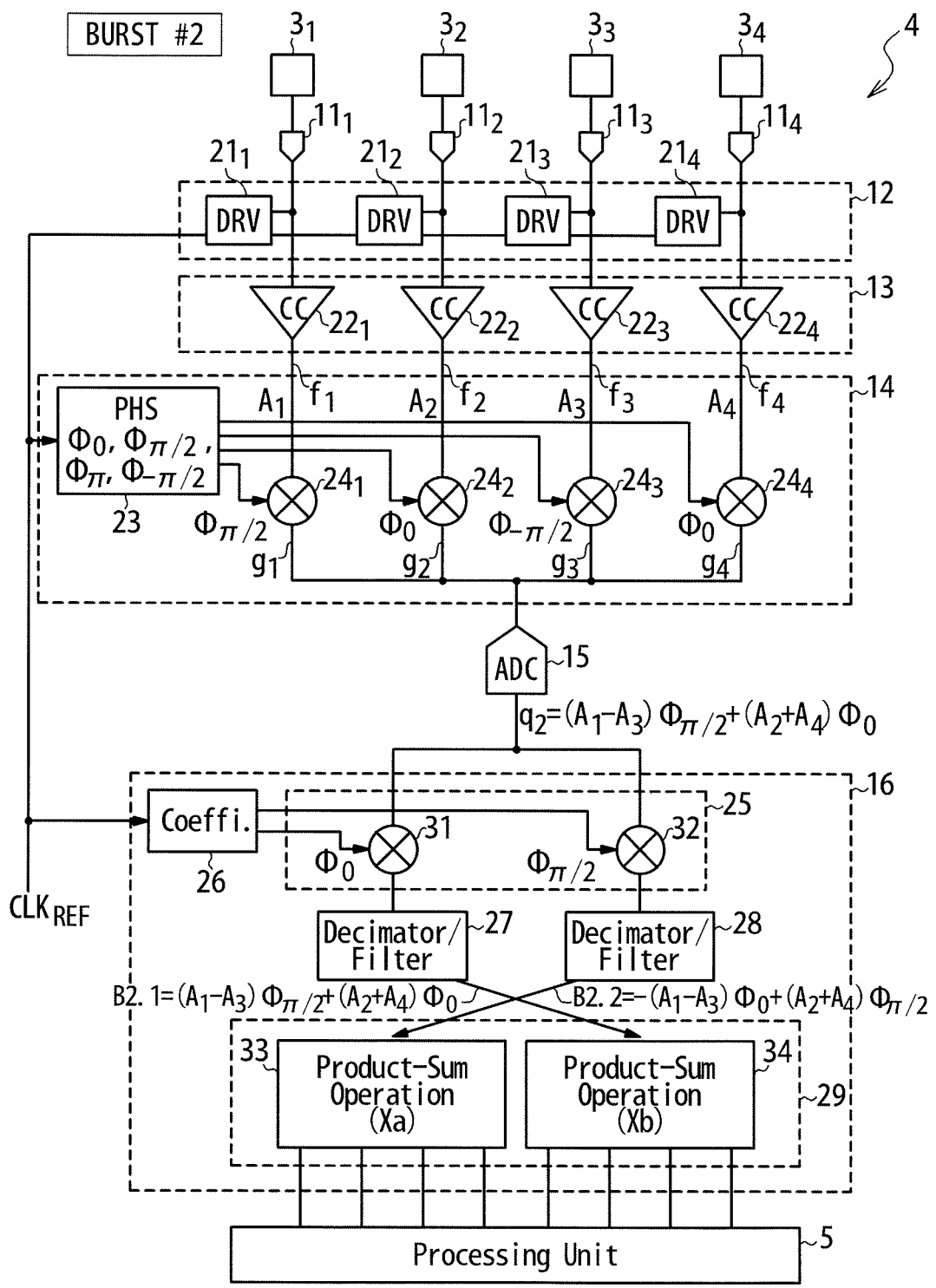

In one or more embodiments, as illustrated in FIG. 6, the mixers 24₁ to 24₄ use the signals $\Phi_{\pi/2}$, $\Phi_0$, $\Phi_{-\pi/2}$, and $\Phi_0$ as the carrier waves Mix1 to Mix4, respectively, and modulate the carrier waves Mix1 to Mix4 with the sensing signals $f_1$ to $f_4$, respectively, during burst #2. In one or more embodiments, this operation corresponds to the second row of the encode matrices $E_1$ and $E_2$ in equation (50). In one or more embodiments, the value $q_2$ of the digital data stream q outputted from the AD converter 15 during burst #2 is given by the following expression (55):

$$q_2=(A_1-A_3)\Phi_{\pi/2}+(A_2+A_4)\Phi_0. \tag{55}$$

In one or more embodiments, the digital mixers 31 and 32 outputs demodulated data B2.1 and B2.2 obtained by multiplying $q_2$ by the coefficients $\Phi_0$ and $\Phi_{\pi/2}$, respectively. In one or more embodiments, the demodulated data B2.1 and B2.2 can be represented by the following expressions (56a) and (56b):

$$B2.1=(A_1-A_3)\Phi_{\pi/2}+(A_2+A_4)\Phi_0, \text{ and} \tag{56a}$$

$$B2.2=-(A_1-A_3)\Phi_0+(A_2+A_4)\Phi_{\pi/2}. \tag{56b}$$

In one or more embodiments, the decimeter/filter 27 outputs the demodulated data B2.1 received from the digital mixer 31 to the product-sum operation circuitry 34, and the decimeter/filter 28 outputs the demodulated data B2.2 received from the digital mixer 32 to the product-sum operation circuitry 33.

Figure 7:
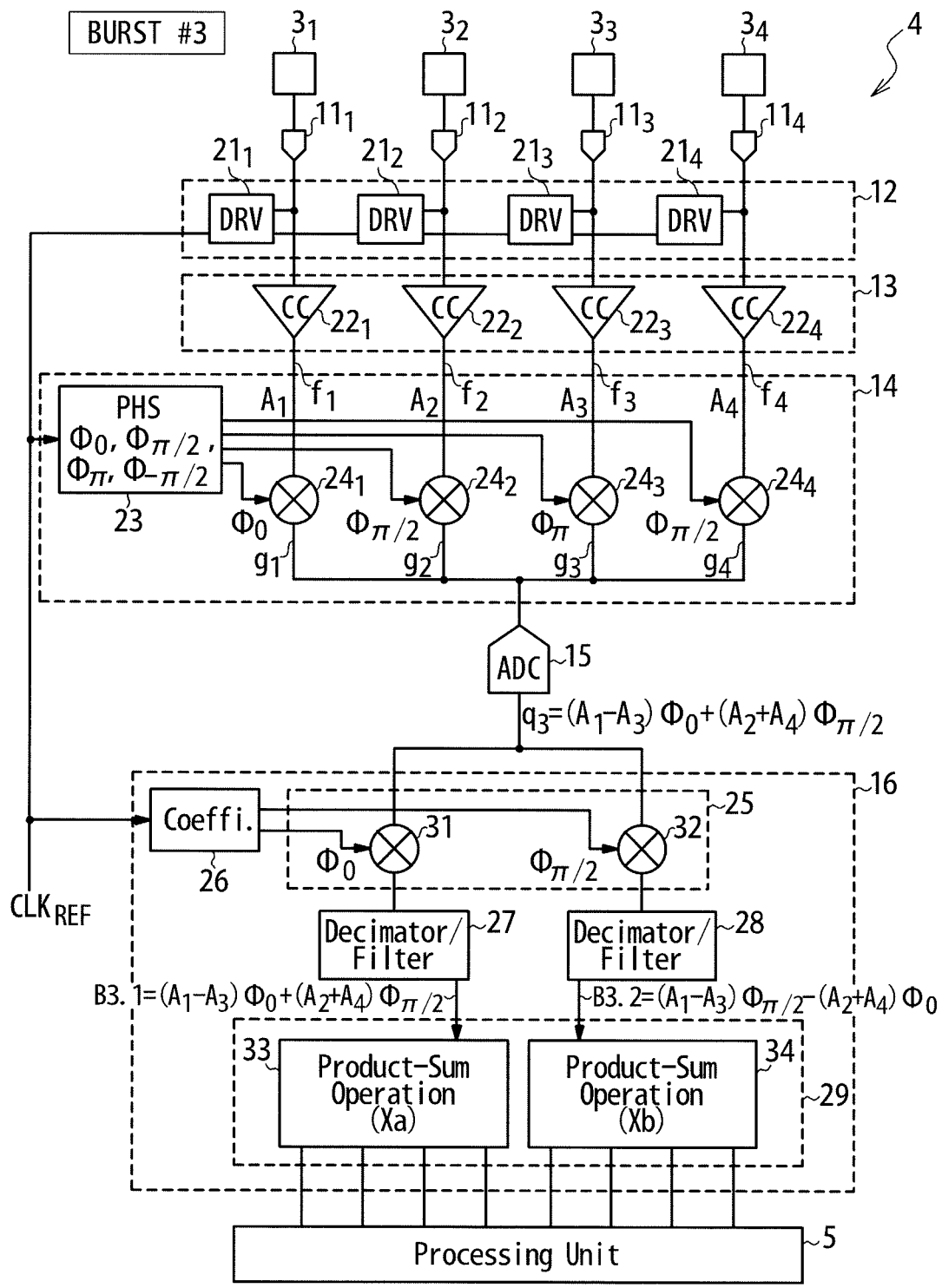

In one or more embodiments, as illustrated in FIG. 7, the mixers 24₁ to 24₄ use the signals $\Phi_0$, $\Phi_{\pi/2}$, $\Phi_0$, and $\Phi_{-\pi/2}$ as the carrier waves Mix1 to Mix4, respectively, and modulate the carrier waves Mix1 to Mix4 with the sensing signals $f_1$ to $f_4$, respectively, during burst #3. In one or more embodiments, this operation corresponds to the third row of the encode matrices $E_1$ and $E_2$ in equation (50). In one or more embodiments, the value $q_3$ of the digital data stream q outputted from the AD converter 15 during burst #3 is given by the following expression (57):

$$q_3=(A_1-A_3)\Phi_0+(A_2+A_4)\Phi_{\pi/2}. \tag{57}$$

In one or more embodiments, the digital mixers 31 and 32 output demodulated data B3.1 and B3.2 obtained by multiplying $q_3$ by the coefficients $\Phi_0$ and $\Phi_{\pi/2}$, respectively. In one or more embodiments, the demodulated data B3.1 and B3.2 can be represented by the following expressions (58a) and (58b):

$$B3.1=(A_1-A_3)\Phi_0+(A_2+A_4)\Phi_{\pi/2}, \text{ and} \tag{58a}$$

$$B3.2=(A_1-A_3)\Phi_{\pi/2}-(A_2+A_4)\Phi_0. \tag{58b}$$

In one or more embodiments, the decimeter/filter 27 outputs the demodulated data B3.1 received from the digital mixer 31 to the product-sum operation circuitry 33, and the decimeter/filter 28 outputs the demodulated data B3.2 received from the digital mixer 32 to the product-sum operation circuitry 34.

Figure 8:
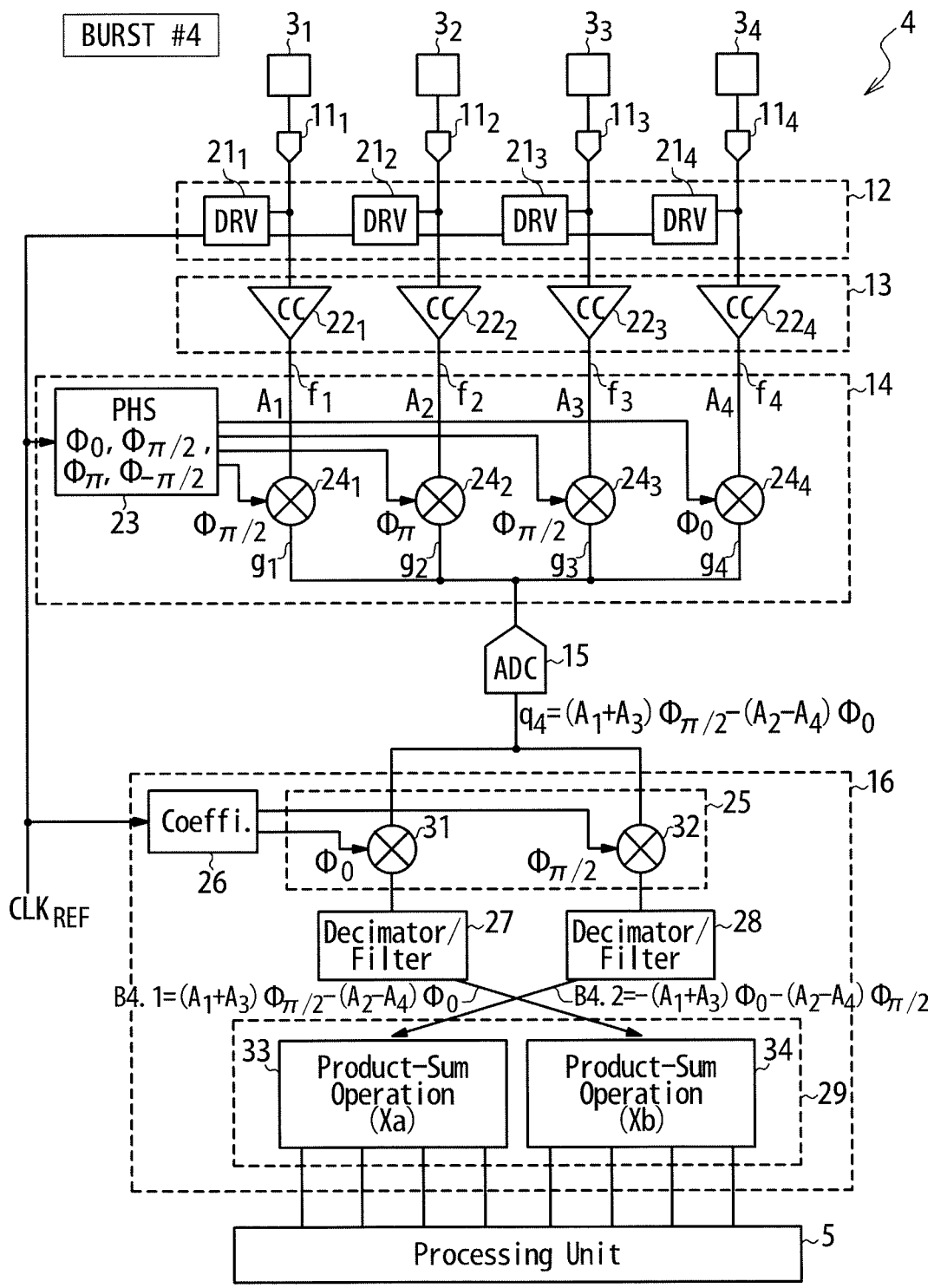

In one or more embodiments, as illustrated in FIG. 8, the mixers 24₁ to 24₄ use the signals $\Phi_{\pi/2}$, $\Phi_0$, $\Phi_{\pi/2}$, and $\Phi_0$ as the carrier waves Mix1 to Mix4, respectively, and modulate the carrier waves Mix1 to Mix4 with the sensing signals $f_1$ to $f_4$, respectively, during burst #4. In one or more embodiments, this operation corresponds to the fourth row of the encode matrices $E_1$ and $E_2$ in equation (50). In one or more embodiments, the value $q_4$ of the digital data stream q outputted from the AD converter 15 during burst #4 is given by the following expression (59):

$$q_4=(A_1+A_3)\Phi_{\pi/2}-(A_2-A_4)\Phi_0. \tag{59}$$

In one or more embodiments, the digital mixers 31 and 32 outputs demodulated data B4.1 and B4.2 obtained by multiplying $q_4$ by the coefficients $\Phi_0$ and $\Phi_{\pi/2}$, respectively. In one or more embodiments, the demodulated data B4.1 and B4.2 can be represented by the following expressions (60a) and (60b):

$$B4.1=(A_1+A_3)\Phi_{\pi/2}-(A_2-A_4)\Phi_0, \text{ and} \quad (60a)$$

$$B4.2=-(A_1+A_3)\Phi_0-(A_2-A_4)\Phi_{\pi/2}. \quad (60b)$$

In one or more embodiments, the decimeter/filter 27 outputs the demodulated data B4.1 received from the digital mixer 31 to the product-sum operation circuitry 34, and the decimeter/filter 28 outputs the demodulated data B4.2 received from the digital mixer 32 to the product-sum operation circuitry 33.

In one or more embodiments, the product-sum operation circuitries 33 and 34 of the decoder 29 performs operations corresponding to the decode matrices $X_a$ and $X_b$ on the data B1.1 to B4.1 and B1.2 to B4.2 received from the decimeter/filters 27 and 28 during bursts #1 to #4 to calculate digital outputs $4A_1\Phi_0$, $4A_2\Phi_0$, $4A_3\Phi_0$, and $4A_4\Phi_0$, which correspond to effective signal components, and digital outputs $4A_1\Phi_{\pi/2}$, $4A_2\Phi_{\pi/2}$, $4A_3\Phi_{\pi/2}$, and $4A_4\Phi_{\pi/2}$, which correspond to noise components. In one or more embodiments, the decode matrices $X_a$ and $X_b$ recites the unit imaginary number i, and accordingly the product-sum operation circuitries 33 and 34 are configured to use values outputted from the digital mixer 32 in performing multiplication by the unit imaginary number i; the product-sum operation circuitries 33 and 34 themselves are configured to perform operations in the real number domain, in one or more embodiments.

In one or more embodiments, the product-sum operation circuitry 33 calculates the digital outputs $4A_1\Phi_0$, $4A_2\Phi_{\pi/2}$, $4A_3\Phi_0$, and $4A_4\Phi_{\pi/2}$ by performing a matrix operation on the demodulated data B1.1, B2.2, B3.1, and B4.2 received during bursts #1 to #4, in accordance with the following expression (61):

$$\begin{pmatrix} 4A_1\Phi_0 \\ 4A_2\Phi_{\pi/2} \\ 4A_3\Phi_0 \\ 4A_4\Phi_{\pi/2} \end{pmatrix} = \begin{pmatrix} 1 & -1 & 1 & -1 \\ -1 & 1 & 1 & -1 \\ 1 & 1 & -1 & -1 \\ 1 & 1 & 1 & 1 \end{pmatrix} \begin{pmatrix} B1.1 \\ B2.2 \\ B3.1 \\ B4.2 \end{pmatrix}. \quad (61)$$

The 4×4 matrix of expression (61), which corresponds to the decode matrix $X_a$, is represented in a form in which no unit imaginary numbers i are recited.

In one or more embodiments, the product-sum operation circuitry 34 calculates the digital outputs $4A_1\Phi_{\pi/2}$, $4A_2\Phi_0$, $4A_3\Phi_{\pi/2}$, and $4A_4\Phi_0$ by performing a matrix operation on the demodulated data B1.2, B2.1, B3.2, and B4.1 received during bursts #1 to #4, in accordance with the following expression (62):

$$\begin{pmatrix} 4A_1\Phi_{\pi/2} \\ 4A_2\Phi_0 \\ 4A_3\Phi_{\pi/2} \\ 4A_4\Phi_0 \end{pmatrix} \begin{pmatrix} 1 & 1 & 1 & 1 \\ 1 & 1 & -1 & -1 \\ 1 & -1 & -1 & 1 \\ -1 & 1 & -1 & 1 \end{pmatrix} \begin{pmatrix} B1.2 \\ B2.1 \\ B3.2 \\ B4.1 \end{pmatrix}. \quad (62)$$

In one or more embodiments, the processing unit 5 is configured to perform arithmetic processing for proximity sensing of an object to the sensor array 1, based on the digital outputs $4A_1\Phi_0$, $4A_2\Phi_0$, $4A_3\Phi_0$, and $4A_4\Phi_0$, which correspond to the effective signal components.

In one or more embodiments, the processing unit 5 is further configured to perform noise detection based on the digital outputs $4A_1\Phi_{\pi/2}$, $4A_2\Phi_{\pi/2}$, $4A_3\Phi_{\pi/2}$, and $4A_4\Phi_{\pi/2}$, which correspond to the noise components. When the sensing signals $f_1$ to $f_4$ are free from an influence of noise, the digital outputs $4A_1\Phi_{\pi/2}$, $4A_2\Phi_{\pi/2}$, $4A_3\Phi_{\pi/2}$, and $4A_4\Phi_{\pi/2}$ are expected to be zero, in one or more embodiments. If not so, the sensing signals $f_1$ to $f_4$ are determined as experiencing an influence of noise.

Although various embodiments of this disclosure have been specifically described in the above, a person skilled in the art would appreciate that the technologies disclosed in this disclosure may be implemented with various modifications. For example, although embodiments in which self-capacitance sensing is performed have been described in the above, mutual capacitance sensing may be performed, in one or more embodiments. In this case, the sensor array 1 further comprises drive electrodes opposed to the sensing electrodes $3_1$ to $3_Q$, in one or more embodiments. In one or more embodiments, the driver circuitry 12 is configured to supply drive signals to the drive electrodes opposed to the sensing electrodes $3_1$ to $3_Q$.

Figure 9:
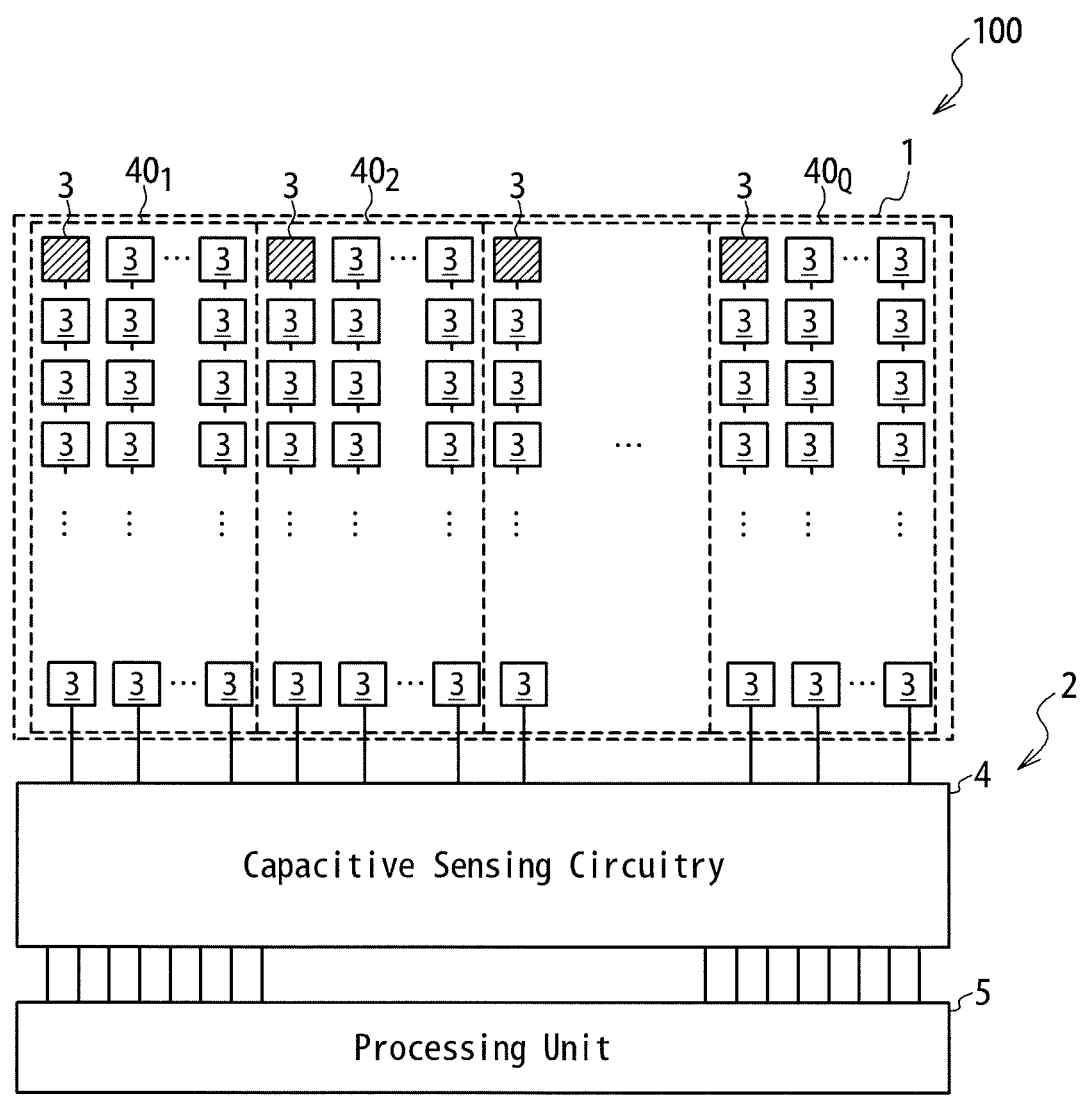
FIG. 9 is a block diagram illustrating a capacitive sensing system, according to one or more embodiments.

Although FIG. 1 illustrates the arrangement in which sensing electrodes 3 associated with one AD converter 15 are arrayed in the vertical direction, the arrangement of sensing electrodes 3 associated with one AD converter 15 may be variously modified. As illustrated in FIG. 9, for example, when sensing electrodes 3 are grouped into Q groups $40_1$ to $40_Q$ arrayed in a specific direction, in the horizontal direction in FIG. 9, Q sensing electrodes 3 belonging to different groups 40 may be selected as sensing electrodes 3 associated with one AD converters 15. For example, the sensing electrodes 3 indicated by the hatchings in FIG. 9 may be selected as sensing electrodes 3 associated with one AD converters 15.

What is claimed is:

1. A semiconductor device, comprising:
    driver circuitry configured to supply a drive signal to a sensor array in a sensing frame comprising 2N bursts, N being an integer of two or more;
    mixer circuitry configured to modulate a plurality of carrier waves with a plurality of sensing signals corresponding to capacitances of a plurality of sensing electrodes of the sensor array, respectively, to output a plurality of mixer outputs, a number of the plurality of sensing electrodes being 2N−1 or 2N;
    an analog-digital (AD) converter configured to perform AD conversion on a sum signal of the plurality of mixer outputs; and
    processing circuitry configured to detect an object based on the output of the AD converter,
    wherein one of a first carrier wave of the plurality of carrier waves and a second carrier wave of the plurality of carrier waves is modulated with one of the plurality of sensing signals during a plurality of first bursts of the 2N bursts, the first carrier wave being in phase with the drive signal, and the second carrier wave having a phase shifted from that of the first carrier wave by π.

2. The semiconductor device, according to claim 1, wherein two of the plurality of first bursts are not adjacent in a time domain.

3. The semiconductor device, according to claim 1, wherein the plurality of sensing signals comprises:
    a first sensing signal associated with a first sensing electrode of the plurality of sensing electrodes; and a second sensing signal associated with a second sensing electrode of the plurality of sensing electrodes; and wherein the first carrier wave or the second carrier wave is modulated with the first sensing signal during a second burst of the 2N bursts, and a third carrier wave of the plurality of carrier waves having a phase different from that of the first and second carrier waves is modulated with the second sensing signal during the second burst.

4. The semiconductor device according to claim 1, wherein a third carrier wave of the plurality of carrier waves having a phase different from that of the first and second carrier waves is modulated with the one of the plurality of sensing signals during a second burst of the 2N bursts other than the plurality of first bursts.

5. The semiconductor device according to claim 4, wherein the second burst is disposed between two of the plurality of first bursts in the sensing frame.

6. The semiconductor device according to claim 1, wherein the processing circuitry is configured to generate a first digital output corresponding to an effective signal component for detecting the object and a second digital output corresponding to a noise component.

7. The semiconductor device according to claim 6, wherein the mixer circuitry is configured to modulate one of the first carrier wave, the second carrier wave, a third carrier wave of the plurality of carrier waves, and a fourth carrier wave of the plurality of carrier waves with each of the plurality of sensing signals to output the plurality of mixer outputs, the third carrier wave having a phase delayed from that of the first carrier wave, and the fourth carrier wave having a phase advanced from that of the first carrier wave, and wherein the processing circuitry comprises:
  a digital demodulator configured to demodulate an output of the AD converter with first and second local carriers, the first local carrier being in phase with the drive signal, and the second local carrier having a phase shifted from that of the first local carrier; and
  a decoder configured to generate the first digital output and the second digital output based on an output of the digital demodulator.

8. The semiconductor device according to claim 1, wherein the driver circuitry comprises a plurality of drivers configured to supply drive signals to the plurality of sensing electrodes, respectively.

9. A capacitive sensing system, comprising:
a sensor array;
driver circuitry configured to supply a drive signal to a sensor array in a sensing frame comprising 2N bursts, N being an integer of two or more;
mixer circuitry configured to modulate a plurality of carrier waves with a plurality of sensing signals corresponding to capacitances of a plurality of sensing electrodes of the sensor array, respectively, to output a plurality of mixer outputs, a number of the plurality of sensing electrodes being 2N−1 or 2N;
an AD converter configured to perform AD conversion on a sum signal of the plurality of mixer outputs; and
processing circuitry configured to detect an object based on the output of the AD converter,
wherein one of a first carrier wave of the plurality of carrier waves and a second carrier wave of the plurality of carrier waves is modulated with one of the plurality of sensing signals during a plurality of first bursts of the 2N bursts, the first carrier wave being in phase with the drive signal, and the second carrier wave having a phase shifted from that of the first carrier wave by $\pi$.

10. The capacitive sensing system according to claim 9, wherein two of the plurality of first bursts are not adjacent in a time domain.

11. The capacitive sensing system according to claim 9, wherein the plurality of sensing signals comprises:
  a first sensing signal of the plurality of sensing signals associated with a first sensing electrode of the plurality of sensing electrodes; and
  a second sensing signal of the plurality of sensing signals associated with a second sensing electrode of the plurality of sensing electrodes; and
  wherein the first carrier wave or the second carrier wave is modulated with the first sensing signal during a second burst of the 2N bursts, and a third carrier wave of the plurality of carrier waves having a phase different from that of the first and second carrier waves is modulated with the second sensing signal during the second burst.

12. The capacitive sensing system according to claim 9, wherein the sensor array is integrated in a display panel.

13. A method, comprising:
supplying a drive signal to a sensor array in a sensing frame comprising 2N bursts, N being an integer of two or more;
modulating a plurality of carrier waves with a plurality of sensing signals corresponding to capacitances of a plurality of sensing electrodes of the sensor array, respectively, to output a plurality of mixer outputs, a number of the plurality of sensing electrodes being 2N−1 or 2N,
performing AD conversion on a sum signal of the plurality of mixer outputs to generate a digital data stream; and
detecting an object based on the digital data stream,
wherein one of a first carrier wave of the plurality of carrier waves and a second carrier wave of the plurality of carrier waves during a plurality of first bursts of the 2N bursts, the first carrier wave being in phase with the drive signal, and the second carrier wave having a phase shifted from that of the first carrier wave by $\pi$.

14. The method according to claim 13, wherein two of the plurality of first bursts are not adjacent in a time domain.

15. The method according to claim 13, wherein the plurality of sensing signals comprises:
  a first sensing signal of the plurality of sensing signals associated with a first sensing electrode of the plurality of sensing electrodes; and
  a second sensing signal of the plurality of sensing signals associated with a second sensing electrode of the plurality of sensing electrodes; and
  wherein the first carrier wave or the second carrier wave is modulated with the first sensing signal during a second burst of the 2N bursts, and a third carrier wave of the plurality of carrier waves having a phase different from that of the first and second carrier waves is modulated with the second sensing signal during the second burst.

16. The method according to claim 13, wherein a carrier wave having a phase different from that of the first and second carrier waves is modulated with the one of the plurality of sensing signals during a second burst of the 2N burst other than the plurality of first bursts.

17. The method according to claim 16, wherein the second burst is disposed between two of the plurality of first bursts in the sensing frame.

18. The method according to claim 13, wherein detecting the object comprises:
  generating a first digital output corresponding to an effective signal component for detecting the object and a second digital output corresponding to a noise component.

19. The method according to claim 18, wherein generating the plurality of mixer outputs comprises:
  modulating one of the first carrier wave, the second carrier wave, a third carrier wave of the plurality of carrier waves, and a fourth carrier wave of the plurality of carrier waves with each of the plurality of sensing signals to output the plurality of mixer outputs, the third carrier wave having a phase delayed from that of the first carrier wave, and the fourth carrier wave having a phase advanced from that of the first carrier wave, and
  wherein generating the first digital output and the second digital output comprises:
    demodulating the digital data stream with first and second local carriers to generate a demodulated data, the first local carrier being in phase with the drive signal, and the second local carrier having a phase shifted from that of the first local carrier; and
    generating the first digital output and the second digital output based on the demodulated data.

20. The method according to claim 13, further comprising:
  supplying a set of drive signals to the plurality of sensing electrodes, respectively.

\* \* \* \* \*